(12) United States Patent  
Park et al.

(10) Patent No.: US 9,384,837 B2  
(45) Date of Patent: Jul. 5, 2016

(54) METHOD OF ERASING MEMORY CELLS WHEN CHANGING THEIR MODE OF OPERATION WITHIN A NONVOLATILE MEMORY DEVICE

(71) Applicants: Hyun-Wook Park, Hwaseong-si (KR); Kitae Park, Seongnam-si (KR); Jaeyong Jeong, Yongin-si (KR)

(72) Inventors: Hyun-Wook Park, Hwaseong-si (KR); Kitae Park, Seongnam-si (KR); Jaeyong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/467,920

(22) Filed: Aug. 25, 2014

(65) Prior Publication Data

US 2015/0103597 A1   Apr. 16, 2015

(30) Foreign Application Priority Data

Oct. 16, 2013 (KR) .......................... 10-2013-0123449

(51) Int. Cl.
  *G11C 16/04* (2006.01)
  *G11C 16/14* (2006.01)
  *G11C 16/34* (2006.01)

(52) U.S. Cl.
  CPC ............ *G11C 16/0483* (2013.01); *G11C 16/14* (2013.01); *G11C 16/3418* (2013.01)

(58) Field of Classification Search
  USPC ..................... 365/185.03, 185.09, 185.29
  See application file for complete search history.

(56) References Cited

U.S. PATENT DOCUMENTS

| 8,407,400 | B2 | 3/2013 | Marotta et al. |
| 2005/0276120 | A1 | 12/2005 | Hsia et al. |
| 2010/0172179 | A1 | 7/2010 | Gorobets et al. |
| 2011/0153919 | A1 | 6/2011 | Sabbag |
| 2013/0003457 | A1 | 1/2013 | Wood et al. |
| 2013/0024606 | A1* | 1/2013 | Suzuki .................. G11C 16/26 711/103 |
| 2014/0293692 | A1* | 10/2014 | Chen ...................... G11C 16/06 365/185.11 |

FOREIGN PATENT DOCUMENTS

| JP | 2008-225576 | 9/2008 |
| JP | 2012-009112 | 1/2012 |
| KR | 1020070024707 A | 3/2007 |
| KR | 1020130079057 A | 7/2013 |

* cited by examiner

*Primary Examiner* — Hoai V Ho

(74) *Attorney, Agent, or Firm* — Volentine & Whitt, PLLC

(57) ABSTRACT

An method of operating a memory system including a plurality of memory cells includes changing an operation mode at least some of the memory cells which operate based on a first operation mode to operate based on a second operation mode; and performing a change erase operation on the memory cells for which an operation mode is changed on the basis of a change erase condition when the operation mode is changed. When memory cells operate in the first operation mode, a normal erase operation is performed based on a first erase condition, and when memory cells operate in the second operation mode, a normal erase operation is performed based on a second erase condition. The change erase condition is different from at least one of the first and second erase conditions.

11 Claims, 24 Drawing Sheets

METHOD OF ERASING MEMORY CELLS WHEN CHANGING THEIR MODE OF OPERATION WITHIN A NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2013-0123449, filed on Oct. 16, 2013, the entire contents of which are hereby incorporated by reference.

BACKGROUND OF THE INVENTION

The present inventive concept herein relates to semiconductor memory devices, and more particularly, to a nonvolatile memory device, a nonvolatile memory system including a nonvolatile memory device and an operating method of a nonvolatile memory system.

A semiconductor memory device is embodied using a semiconductor such as silicon Si, germanium Ge, gallium arsenide GaAs, indium phospide InP, etc. Semiconductor memory device may be classified into volatile memory devices and nonvolatile memory devices.

A volatile memory device loses its stored data when its power supply is interrupted. Examples of a volatile memory device include a static RAM (SRAM), a dynamic RAM (DRAM), a synchronous DRAM (SDRAM), etc. A nonvolatile memory device retains its stored data even when its power supply is interrupted. Examples of a nonvolatile memory device include a read only memory (ROM), a programmable ROM (PROM), an electrically programmable ROM (EPROM), an electrically erasable programmable ROM (EEPROM), a flash memory device, a phase-change RAM (PRAM), a magnetic RAM (MRAM), a resistive RAM (RRAM or ReRAM), a ferroelectric RAM (FRAM), etc.

To improve the integration of a semiconductor memory, a multi level cell (MLC) that stores at least 2 bits in one memory cell is being used. However, a multi level cell (MLC) has low reliability and a low operating speed as compared with a single level cell (SLC). To extend the life of a memory device and improve the performance of a memory device, a memory device including a SLC and a MLC in one semiconductor memory is being provided.

SUMMARY

One aspect of exemplary embodiments of the inventive concept provides a method of operating a memory system including a plurality of memory cells. The method may include changing an operation mode of at least some memory cells among the plurality of memory cells which operate based on a first operation mode to operate based on a second operation mode; and performing a change erase operation on the memory cells for which the operation mode is changed, on the basis of a change erase condition when the operation mode is changed. When memory cells among the plurality of memory cells operate in the first operation mode, a normal erase operation is performed based on a first erase condition and when memory cells among the plurality of memory cells operate in the second operation mode, a normal erase operation is performed based on a second erase condition. The change erase condition is different from at least one of the first and second erase conditions.

Another aspect of exemplary embodiments of the inventive concept provides a nonvolatile memory system. The nonvolatile memory system may include a nonvolatile memory device including a plurality of memory cells that are configured to operate based on a first operation mode; and a memory controller configured to control the nonvolatile memory device. The memory controller is configured to change an operation mode of at least some of the plurality of memory cells that operate based on the first operation mode to operate based on a second operation mode. The nonvolatile memory device is configured to erase the memory cells among the plurality of memory cells that operate based on the first operation mode on a basis of a first erase condition. The nonvolatile memory device is also configured to erase memory cells of the nonvolatile memory device which operate based on the second operation mode on a basis of a second erase condition. The nonvolatile memory device is further configured to perform a change erase operation on the at least some memory cells for which the operation mode is changed to the second operation mode on a basis of a change erase condition. The change erase condition is different from at least one of the first and second erase conditions.

Another aspect of exemplary embodiments of the inventive concept also provides a nonvolatile memory device. The nonvolatile memory device may include a memory cell array comprising a plurality of memory cells that are configured to operate based on a plurality of operation modes; an address decoder connected to the memory cell array through a plurality of word lines; a write & read circuit connected to the memory cell array through a plurality of bit lines; and control logic configured to receive a control signal from outside the nonvolatile memory device to control the address decoder and the write & read circuit. The control signal comprises operation mode change information for at least one memory cell among the plurality of memory cells. The control logic is configured to erase at least one memory cell among the plurality of memory cells on the basis of a change erase condition in response to the control signal. The change erase condition is different from at least one among a plurality of erase conditions corresponding to the operation modes respectively.

Still another aspect of exemplary embodiments of the inventive concept provides a method of operating a memory system including a plurality of memory cells. The method may include changing an operation mode of at least some memory cells among the plurality of memory cells which operate based on a first operation mode to operate based on a second operation mode; performing a pre-program operation on the at least some memory cells for which the operation mode is changed when the operation mode is changed; and performing a change erase operation on the pre-programmed memory cells on the basis of a change erase condition. For the memory cells among the plurality of memory cells which operate in the first operation mode, a normal erase operation is performed based on a first erase condition, and when memory cells among the plurality of memory cells operate in the second operation mode, a normal erase operation is performed based on a second normal condition. The change erase condition is different from at least one of the first and second erase conditions.

Yet another aspect of exemplary embodiments of the inventive concept provides a method of operating a memory system including at least one nonvolatile memory device having a plurality of memory cells. The method may include: operating at least some of the plurality of memory cells in a first operating mode, wherein when the memory cells operating in the first operating mode are erased in the first operating mode, the memory cells operating in the first operating mode are erased based on a first erase condition; changing an operating mode of at least one of the memory cells operating in the first operating mode to operate in a second operating mode, including erasing the at least one of the memory cells based on a change erase condition which is different from the first erase condition; and subsequent to the changing, operating the at least one memory cell in the second operating mode, wherein when the at least one memory cell operating in the second operating mode is erased in the second operating mode, the at least one memory cell is erased based on a second erase condition different from the first operating condition.

BRIEF DESCRIPTION OF THE FIGURES

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Figure 1:
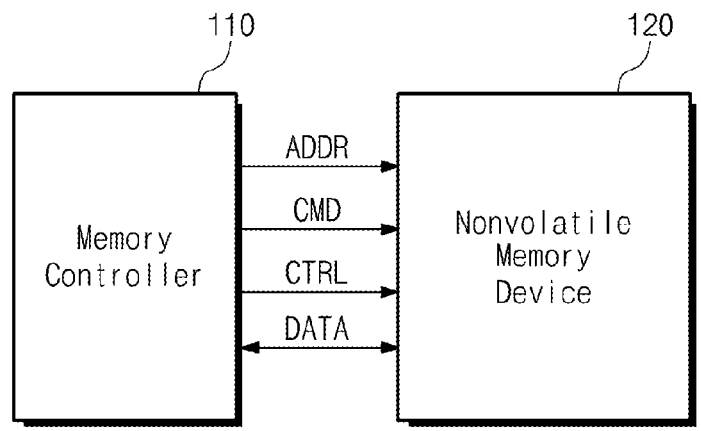
FIG. 1 is a block diagram illustrating a nonvolatile memory system in accordance with an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory system in accordance with an inventive concept may operate based on a plurality of operation modes. For example, a nonvolatile memory system may operate based on a first mode of operation (e.g., an operation mode based on a single level cell (SLC)). An operation of a nonvolatile memory system can be changed to a second operation mode (e.g., an operation mode based on a triple level cell (TLC)) while it operates in the first operation mode. In this case, the nonvolatile memory system performs a change erase operation on the basis of a change erase condition so that memory cells have an optimum threshold voltage distribution corresponding to the second operation mode (i.e., a changed operation mode).

In exemplary embodiments, the change erase condition may be an erase condition different from first and second erase conditions which are applied in the first and second operation modes. The change erase operation is an erase operation making an erase state of memory cells, for which an operation mode is to be changed, become an optimum erase state corresponding to the new operation mode to which the cells are to be changed. Thus, when an operation mode of a nonvolatile memory system is changed, since memory cells have an optimum erase state corresponding to the new operation mode to which the cells are to be changed, a nonvolatile memory device having improved performance may be provided.

FIG. 1 is a block diagram illustrating a nonvolatile memory system 100 in accordance with an embodiment of the inventive concept. Referring to FIG. 1, nonvolatile memory system 100 includes a memory controller 110 and a nonvolatile memory device 120.

Memory controller 110 can control nonvolatile memory device 120 according to signals received from an external device (e.g., a host, an Application Processor (AP), etc.). For example, memory controller 110 can transmit data DATA, an address ADDR, a command CMD, and a control signal CTRL to nonvolatile memory device 120 in response to a write request received from an external device.

Nonvolatile memory device 120 can perform read, write and erase operations under the control of memory controller 110. Nonvolatile memory device 120 may be provided based on a nonvolatile semiconductor device such as a NAND flash, a NOR flash, a MRAM, an ReRAM, a PRAM, etc. For ease of description, it is assumed in the description to follow that nonvolatile memory device 120 is provided as a NAND flash memory device. However, the inventive concept is not limited to this example.

Nonvolatile memory system 100 can change an operation mode. For example, nonvolatile memory system 100 can change an operation mode according to control of an external device. Nonvolatile memory system 100 can change an operation mode on the basis of the number of program and erase cycles which have been performed on memory cells of nonvolatile memory device 120. A method of changing an operation mode of nonvolatile memory system 100 will be described in further detail with reference to FIGS. 17 to 20.

An operation mode may indicate the number of data bits stored in each of the memory cells included in nonvolatile memory device 120. For example, in the case that first memory cells included in nonvolatile memory device 120 operate in a single-level cell (SLC) operation mode, each of the first memory cells stores one data bit. In the case that second memory cells included in nonvolatile memory device 120 operate in a multi-level cell (MLC) operation mode, each of the second memory cells stores at least two data bits. However, the inventive concept is not limited to this example. Each of a plurality of memory cells included in nonvolatile memory device 120 may operate based on a plurality of operation modes.

Figure 2:
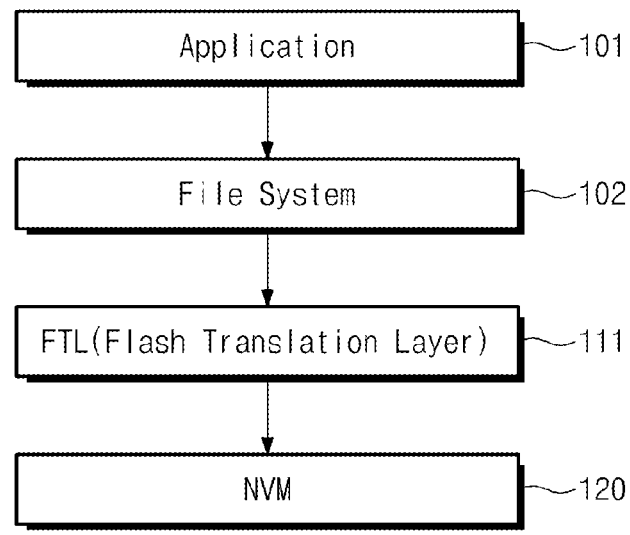
FIG. 2 is a block diagram illustrating a software layer of the nonvolatile memory system illustrated in FIG. 1.

FIG. 2 is a block diagram illustrating a software layer of nonvolatile memory system 100. Referring to FIG. 2, a software layer of nonvolatile memory system 100 includes an application 101, a file system 102, a flash translation layer (FTL) 111 and nonvolatile memory device 120.

Application 101 indicates a variety of application programs being driven in an external device. For example, application 101 may include a variety of application programs such as a text editor, a web browser, a video player, a game program, etc.

In the case that a file or data is stored in nonvolatile memory device 120, file system 102 performs a function of organizing the file or data. For example, file system 102 can provide a logical address according to a write request to memory controller 110. File system 102 may have a different form depending on an operating system (OS) of an external device. File system 102 may include a File Allocation Table (FAT), FAT32, NT File System (NTFS), Hierarchical File System (HFS), Journaled File System2 (JSF2), XFS, On-Disk Structure-5 (ODS-5), UDF, ZFS, Unix File System (UFS), ext2, ext3, ext4, ReiserFS, Reiser4, ISO 9660, GnomeVFS, BFS or WinFS. Application 101 and file system 102 can be driven by an external device (e.g., a host, AP, etc.).

Flash translation layer (FTL) 111 can provide an interface between an external device and nonvolatile memory device 120 so that nonvolatile memory device 120 is effectively used. FTL 111 performs a function of translating a logical address generated by file system 102 into a physical address that can be used in nonvolatile memory device 120. FTL 111 manages an address translation through a mapping table. FTL 111 may be driven by memory controller 110.

FTL 111 may control an operation mode of nonvolatile memory device 120. In the case that nonvolatile memory device 120 operates in a first operation mode (e.g., a SLC operation mode), at least 128 memory cells are needed to store 128 bits of data In the case that nonvolatile memory device 120 operates in a second operation mode (e.g., an MLC operation mode), fewer than 128 memory cells (e.g., 64 memory cells) may be needed to store 128 bits of data. Accordingly, FTL 111 performs an address translation on the basis of an operation mode of nonvolatile memory device 120.

Nonvolatile memory system 100 can operate based on a plurality of operation modes. When an operation mode is changed, nonvolatile memory system 100 performs a change erase operation on the basis of a change erase condition, which may improve the reliability of nonvolatile memory system 100.

Figure 3:
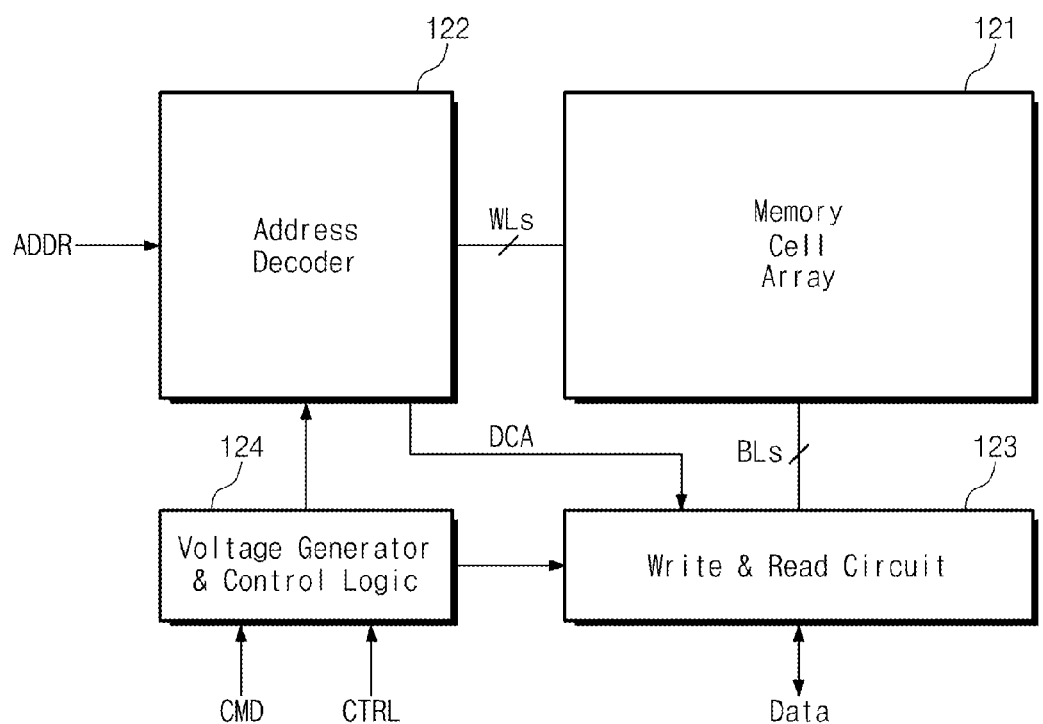
FIG. 3 is a block diagram illustrating in detail an example embodiment of the nonvolatile memory device illustrated in FIG. 1.

FIG. 3 is a block diagram illustrating in detail an example embodiment of nonvolatile memory device 120. Referring to FIG. 3, nonvolatile memory device 120 includes a memory cell array 121, an address decoder 122, a write & read circuit 123, and a voltage generator & control logic 124.

Memory cell array 121 is connected to address decoder 122 through a plurality of word lines WLs and is connected to write & read circuit 123 through a plurality of bit lines BLs. Memory cell array 121 includes a plurality of memory blocks. Each memory block is constituted by a plurality of pages. Each page includes a plurality of memory cells. In exemplary embodiments, each of the memory cells may operate as a single level cell or a multi level cell, depending on the operation mode of nonvolatile memory system 100.

Address decoder 122 is connected to memory cell array 121 through a plurality of word lines WLs. Address decoder 122 operates under control of voltage generator & control logic 124. Address decoder 122 receives an address ADDR from an external device.

Address decoder 122 decodes a row address among the received addresses. Address decoder 122 selects word lines WLs using the decoded row address. Address decoder 122 can receive various voltages from voltage generator & control logic 124 to transmit the received voltages to word lines WLs respectively.

Address decoder 122 decodes a column address (DCA) among the received addresses. The decoded column address DCA is transmitted to write & read circuit 123. Address decoder 122 includes constituent elements such as a row decoder, a column decoder, an address buffer, etc.

Write & read circuit 123 is connected to memory cell array 121 through bit lines BLs and exchanges data with an external device disposed outside of memory device 120 (e.g., with memory controller 110). Write & read circuit 123 operates under the control of voltage generator & control logic 124. Write & read circuit 123 receives the decoded column address DCA from address decoder 122. Write & read circuit 123 selects bit lines BLs using the decoded column address DCA.

Write & read circuit 123 includes constituent elements such as a page buffer (or a page register), a column select circuit, a data buffer, etc. Write & read circuit 123 also includes constituent elements such as a sense amplifier, a write driver, a column select circuit, a data buffer, etc.

Voltage generator & control logic 124 is connected to address decoder 122 and write & read circuit 123. Voltage generator & control logic 124 is configured to control an overall operation of nonvolatile memory device 120. Voltage generator & control logic 124 generates various voltages required by nonvolatile memory device 120. Voltage generator & control logic 124 operates according to a control signal CTRL and a command CMD received from an external device (e.g., memory controller 110). Voltage generator & control logic 124 can generate voltages (for example, an erase voltage, an erase verification voltage, etc.) for an erase operation. In this case, voltage generator & control logic 124 generates voltages for an erase operation corresponding to first and second erase conditions and change erase condition.

For ease of description, it is assumed that nonvolatile memory device 120 performs an erase operation by a memory block unit and an operation mode is changed based on an erase unit. That is, memory blocks included in nonvolatile memory device 120 can operate based on a plurality of operation modes and an operation mode can be changed for a memory block unit under the control of memory controller 110. However, the inventive concept is not limited to this example. Nonvolatile memory device 120 can perform an erase operation in units of a memory block, a sub block, a word line, a page or a memory cell unit. An operation mode can be changed in units of a memory block, a sub block, a word line, a page or a memory cell unit.

Hereinafter, it is assumed that a first operation mode MODE_1 is a single level cell (SLC) operation mode and a second operation mode MODE_2 is a triple level cell (TLC) operation mode. However, the inventive concept is not limited to this example. Each of the first and second operation modes MODE_1 and MODE_2 can be extended to an operation mode storing one data bit or multiple data bits in one memory cell such as a single level cell (SLC) or a multilevel cell (MLC).

Figure 4:
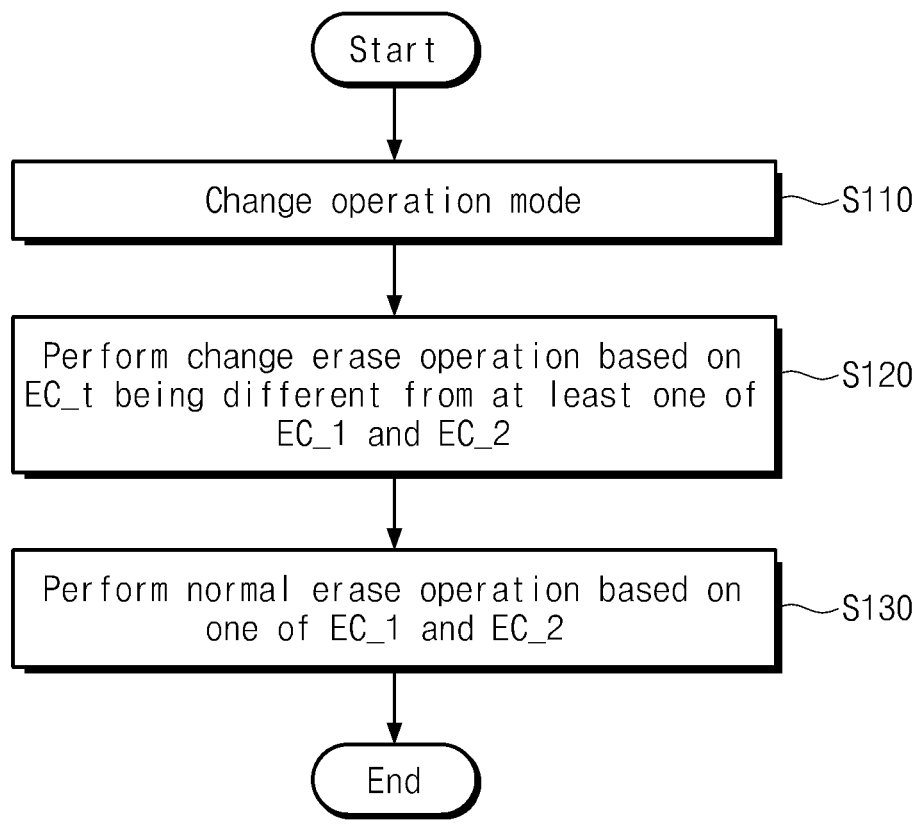
FIG. 4 is a flow chart illustrating a method of operating the nonvolatile memory system illustrated in FIG. 1.

FIG. 4 is a flow chart illustrating a method of operating of nonvolatile memory system 100. Referring to FIG. 4, in an operation S110, nonvolatile memory system 100 can change an operation mode of a portion of the memory blocks of memory device 120. For example, nonvolatile memory system 100 can operate based on the first and second operation modes MODE_1 and MODE_2. Nonvolatile memory system 100 can change an operation mode so that memory blocks that have been operating based on the first operation mode MODE_1 will now operate based on the second operation mode MODE_2. Nonvolatile memory system 100 can also change an operation mode so that memory blocks that have been operating based on the second operation mode MODE_2 will now operate based on the first operation mode MODE_1.

In an operation S120, nonvolatile memory system 100 performs a change erase operation based on a change erase operation EC_t different from at least one of first and second erase conditions EC_1 and EC_2.

In exemplary embodiments, nonvolatile memory system 100 may perform a normal erase operation on memory blocks that operate based on the first operation mode MODE_1 on the basis of the first erase condition EC_1. Nonvolatile memory system 100 may perform a normal erase operation on memory blocks that operate based on the second operation mode MODE_2 on the basis of the second erase condition EC_2. The normal erase operation indicates an erase operation of erasing a memory block when an operation mode is not changed (i.e., while continuing to operate based on the first or second operation mode).

The erase condition may include operation conditions such as an erase voltage, an erase verification voltage, the number of times an erase loop is repeated, etc. The change erase operation can be performed one time when the operation mode is changed. The change erase operation of nonvolatile memory system 100 will be described in further detail with reference to drawings below.

In an operation S130, after performing a change erase operation, nonvolatile memory system 100 performs a normal erase operation on the basis of any one of the first and second erase conditions EC_1 and EC_2. Nonvolatile memory system 100 can perform a normal erase operation on the basis of an erase condition (one of the first and second erase conditions EC_1 and EC_2) corresponding to a changed operation mode.

Figure 5:
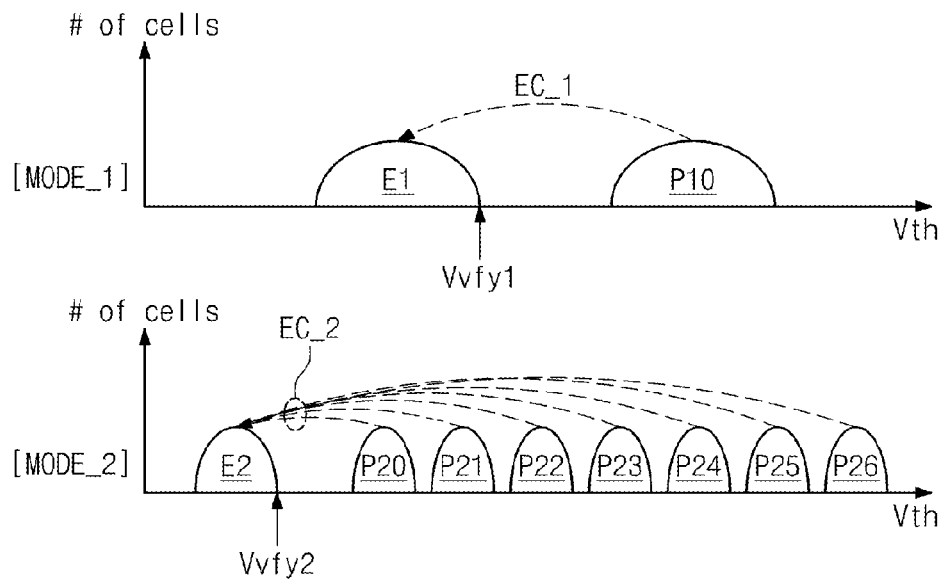
FIG. 5 is a drawing for explaining a method of erasing memory blocks that operate based on first and second operation modes illustrated in FIG. 4.

FIG. 5 is a drawing for explaining a method of erasing memory blocks that operate based on first and second operation modes illustrated in FIG. 4. Referring to FIGS. 1 and 5, nonvolatile memory system 100 can operate based on the first operation mode MODE_1. In this case, memory cells included in a memory block that operate based on the first operation mode MODE_1 may be programmed to have any one of a first erase state E1 and a program state P10. Nonvolatile memory system 100 performs a normal erase operation on a memory block that operates based on the first operation mode MODE_1 on the basis of the first erase condition EC_1. That is, in an erase operation, a normal erase operation is performed so that memory cells corresponding to the program state P10 have the first erase state E1.

Nonvolatile memory system 100 can operate based on the second operation mode MODE_2. In this case, memory cells included in a memory block that operates based on the second operation mode MODE_2 may be programmed to have any one of a second erase state E2 and program states P20 to P26. Nonvolatile memory system 100 performs a normal erase operation on a memory block that operates based on the second operation mode MODE_2 on the basis of the second erase condition EC_2. That is, in an erase operation, a normal erase operation is performed so that memory cells corresponding to the program states P20 to P26 have the second erase state E2.

The first erase condition EC_1 may include a condition wherein the memory cells which operate in the first operation mode are erased to have a threshold voltage which is less than a first erase verification voltage Vvfy1. The second erase condition EC_2 may include a condition wherein the memory cells which operate in the second operation mode are erased to have a threshold voltage which is less than a second erase verification voltage Vvfy2. The first erase verification voltage Vvfy1 may be greater than the second erase verification voltage Vvfy2.

The first and second erase states E1 and E2 may be optimum threshold voltage distributions of erase states corresponding to the first and second operation modes MODE_1 and MODE_2 respectively. The threshold voltage distribution of the first erase state E1 may have a voltage level which is, in whole or in part, greater than the threshold voltage distribution of the second erase state E2. The threshold voltage distribution of the first erase state E1 may be wider than the threshold voltage distribution of the second erase state E2.

Figure 6:
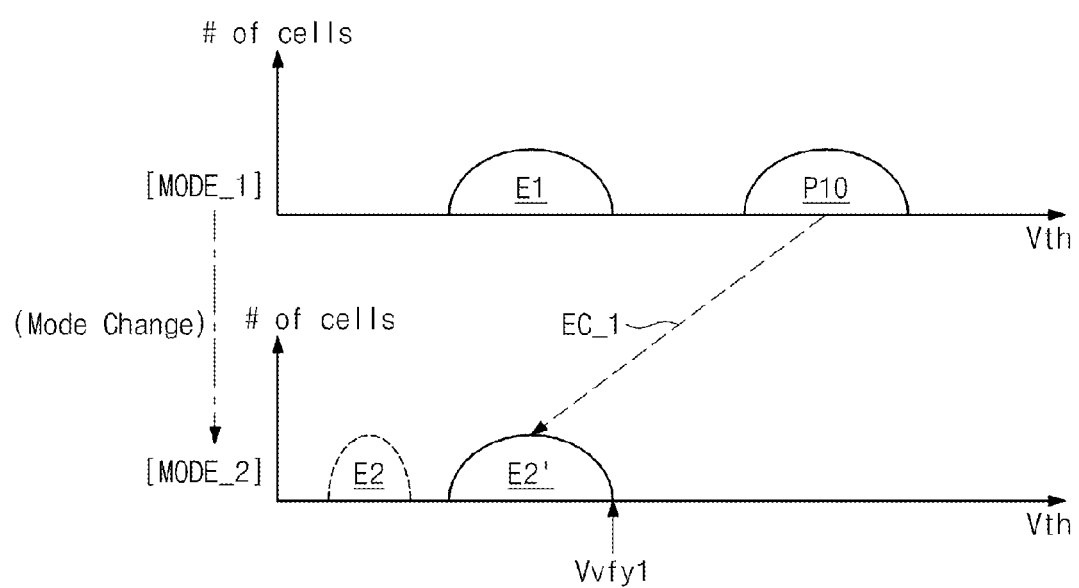
FIGS. 6 and 7 drawings for explaining an operation of the nonvolatile memory system illustrated in FIG. 4.
Figure 7:
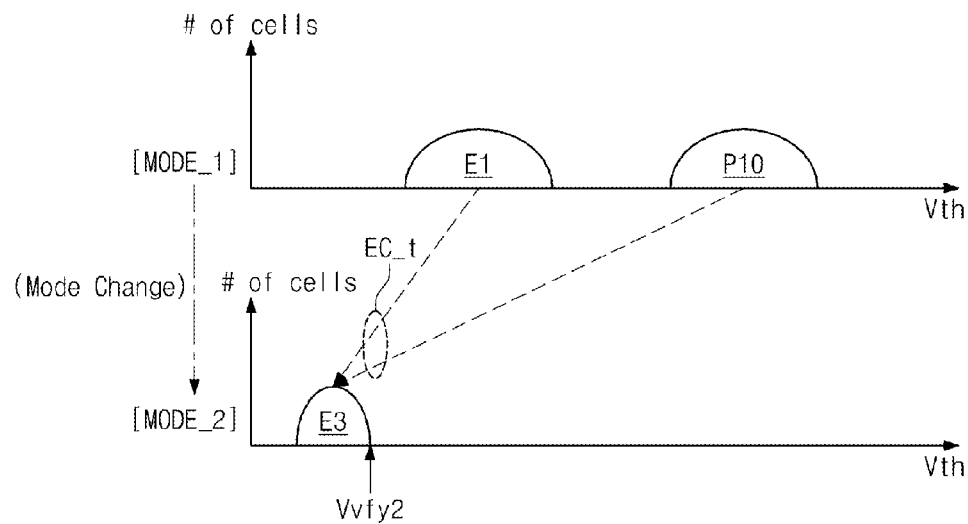

FIGS. 6 and 7 drawings for explaining an operation of the nonvolatile memory system illustrated in FIG. 4. Referring to FIG. 6, in the case that an operation mode of a portion of the memory blocks of memory device 120 is changed from the first operation mode MODE_1 to the second operation mode MODE_2, nonvolatile memory system 100 could perform a change erase operation on the memory block(s) for which an operation mode is changed on the basis of the first erase condition EC_1. In this case, erase states of memory cells of the memory block of which an operation mode is changed may be an erase state E2'.

Memory cells of memory blocks changed to the second operation mode MODE_2 should be programmed to have any one of the second erase state E2 and the program states P20~P26, as shown in FIG. 5. However, as illustrated in FIG. 6, when an operation mode is changed from the first operation mode MODE_1 to the second operation mode MODE_2 based on the first erase condition EC_1, memory cells of which an operation mode is changed to the second operation mode MODE_2 have an erase state of E2'. That is, in the case that a change erase operation is performed based on the first erase condition EC_1, a program error may occur when a program operation of the second operation mode MODE_2 is performed. Thus, reliability of the nonvolatile memory system 100 may be reduced.

Referring to FIG. 7, in the case that an operation mode of a portion of the memory blocks is changed from the first operation mode MODE_1 to the second operation mode MODE_2, nonvolatile memory system 100 can perform a change erase operation on the memory block of which an operation mode is changed on the basis of the change erase condition EC_t. The change erase condition EC_t indicates an erase condition erasing memory cells so that the memory cells of the first erase state E1 and the program state P10 have a third erase state E3. The threshold voltage distribution of the third erase state E3 has a voltage level which is, in whole or in part, less than the threshold voltage distribution of the first erase state E1. In some embodiments, including this example, the third erase state E3 is the same as the second erase state E2. In this case, memory cells to be operated based on the second operation mode MODE_2 have the second erase state E2. The second erase state E2 indicates an optimum threshold voltage distribution of an erase state corresponding to the second operation mode MODE_2.

The change erase condition EC_t may include a condition wherein the erased memory cells have a threshold voltage which is less than an erase verification voltage equal to or less than the second verification voltage Vvfy2. The magnitude of an erase voltage applied for the change erase condition EC_t may be greater than an erase voltage applied for the first erase condition EC_1. The number of times that an erase loop is repeated for the change erase condition EC_t may be greater than the number of times of an erase loop is repeated for the first erase condition EC_1.

According to the embodiments described above, in the nonvolatile memory system 100, by performing a change erase operation on the basis of the change erase condition EC_t, memory cells of memory blocks for which an operation mode is changed may have an optimum threshold voltage distribution of the erase state corresponding to a changed operation mode. Thus, in a program operation after an operation mode is changed, a program error may be reduced.

Figure 8:
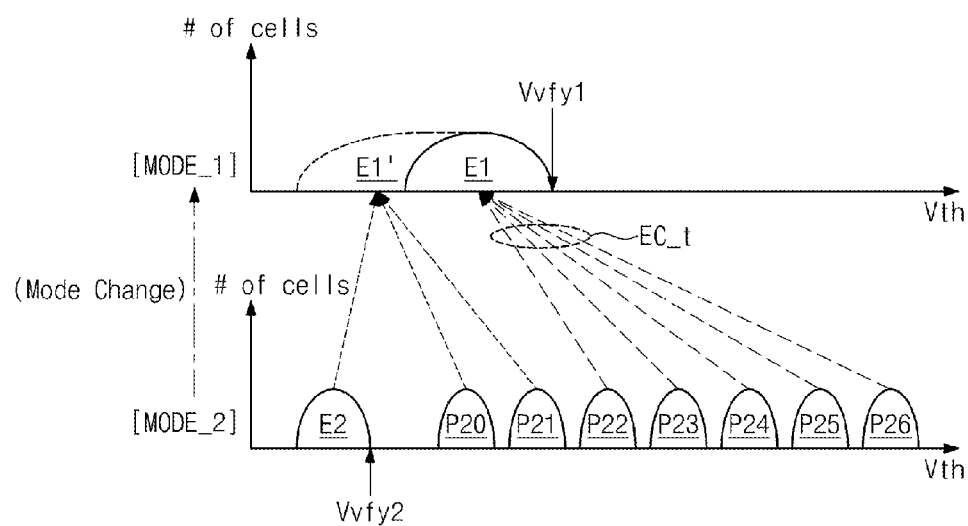
FIG. 8 is a drawing for explaining an erase operation of a nonvolatile memory system in accordance with another embodiment of the inventive concept.

FIG. 8 is a drawing for explaining an erase operation of a nonvolatile memory system in accordance with another embodiment of the inventive concept. In the case that an operation mode is changed from the second operation mode MODE_2 to the first operation mode MODE_1, an operation of nonvolatile memory system 100 is described with reference to FIG. 8.

Referring to FIG. 8, a part of memory blocks of nonvolatile memory system 100 may operate based on the second operation mode MODE_2. Each of memory cells of a portion of the memory blocks which operate in the second operation mode MODE_2 may have one of the second erase state E2 and the program states P20~P26.

Nonvolatile memory system 100 can change an operation mode of a portion of the memory blocks from the second operation mode MODE_2 to the first operation mode MODE_1. At this time, nonvolatile memory system 100 can perform a change erase operation on the basis of the change erase condition EC_t so that memory cells of memory blocks to be changed to the first operation mode MODE_1 have a threshold voltage distribution of the first erase state E1.

In exemplary embodiments, a change erase operation for memory cells (e.g., the second erase state E2 and the program states P20 and P21) having a threshold voltage distribution whose voltage levels are less than, or within, the threshold voltage distribution of the first erase state E1 may be omitted. In exemplary embodiments, the memory cells having a threshold voltage distribution less than the threshold voltage distribution of the first erase state E1 may be erased to have an erase state of E1'. The erased memory cells of the erased state E1' for the change erase condition EC_t may have a threshold voltage which is less than an erase verification voltage which is less than or equal to the first erase verification voltage Vvfy1.

In the case that nonvolatile memory system 100 is changed to the first operation mode MODE_1, since memory cells which will operate in the first operation mode MODE_1 have the threshold voltage distribution of the first erase state E1 (or the erase state E1'), reliability of nonvolatile memory system 100 may be improved.

Figure 9:
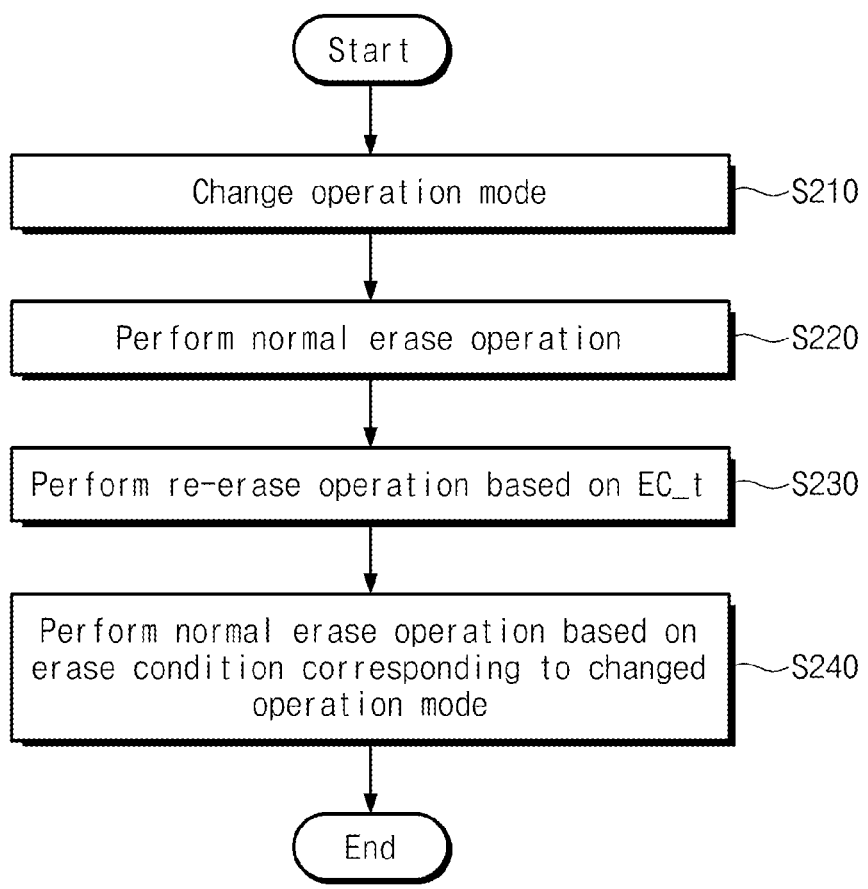
FIG. 9 is a flow chart illustrating an operation of a nonvolatile memory system in accordance with still another embodiment of the inventive concept.

FIG. 9 is a flow chart illustrating an operation of a nonvolatile memory system in accordance with still another embodiment of the inventive concept. Referring to FIGS. 1 and 9, in an operation S210, nonvolatile memory system 100 can change an operation mode. Operation S210 is the same as the operation S110 of FIG. 4.

In an operation S220, nonvolatile memory system 100 can perform a normal erase operation. For example, an operation mode of memory blocks included in nonvolatile memory system 100 can be changed from the first operation mode MODE_1 to the second operation mode MODE_2. In this case, nonvolatile memory system 100 performs a normal erase operation on memory blocks of which an operation mode is changed to the second operation mode MODE_2 on the basis of the first erase condition EC_1 (i.e., an erase condition corresponding to the operation mode before the operation mode is changed). After the normal erase operation is performed, memory cells included in the memory blocks of which an operation mode is changed may have an erase state corresponding to the first operation mode MODE_1.

In an operation S230, nonvolatile memory system 100 performs a re-erase operation on the basis of the change erase condition EC_t. For example, nonvolatile memory system 100 performs a re-erase operation on memory cells erased through the normal erase operation S220 on the basis of the change erase condition EC_t. After the re-erase operation is performed, the memory cells included in the memory blocks for which an operation mode is changed may have an optimum erase state corresponding to the changed operation mode.

In an operation S240, nonvolatile memory system 100 performs a normal erase operation on the basis of an erase condition corresponding to the changed operation mode.

Figure 10:
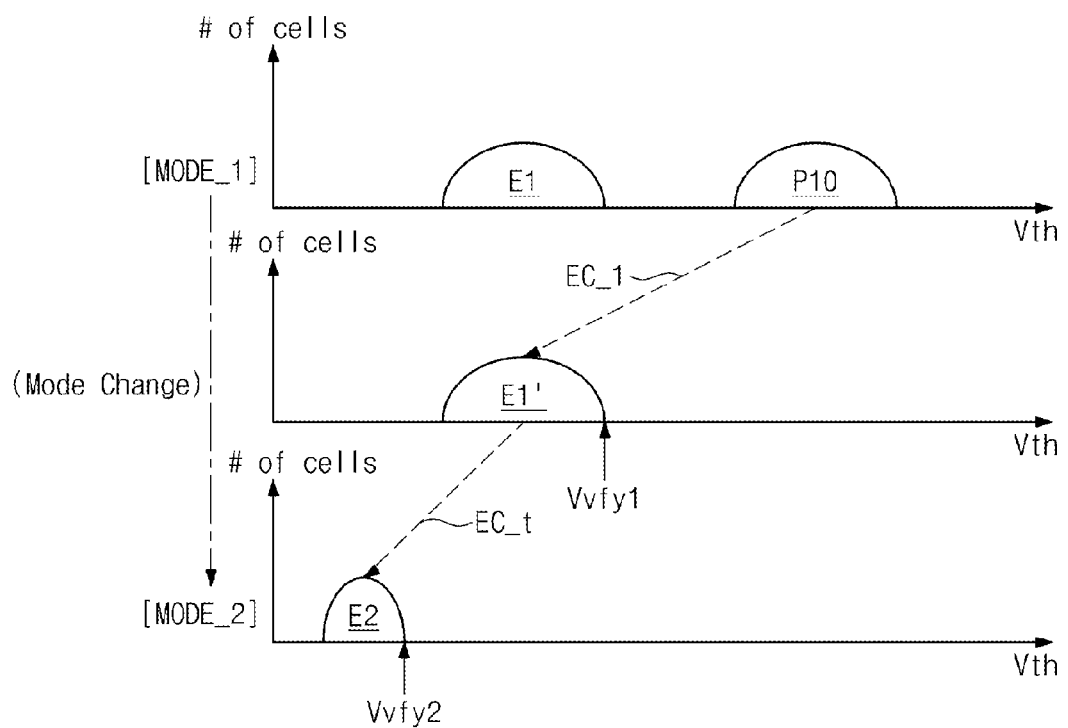
FIG. 10 is a drawing for explaining the operation of the nonvolatile memory system illustrated in FIG. 9.

FIG. 10 is a drawing for describing the operation of the nonvolatile memory system illustrated in FIG. 9. Referring to FIGS. 9 and 10, nonvolatile memory system 100 can change an operation mode of memory blocks that operate based on the first operation mode MODE_1 to the second operation mode MODE_2.

At this time, nonvolatile memory system 100 can perform a normal erase operation on the basis of the first erase condition EC_1. In the case of performing a normal erase operation on the basis of the first erase condition EC_1, memory cells may have a threshold voltage distribution like E1'. After that, nonvolatile memory system 100 can perform a re-erase operation on the memory cells having a threshold voltage distribution of E1' on the basis of the change erase condition EC_t. In the case of performing a re-erase operation on the basis of the change erase condition EC_t, the memory cells of the memory blocks of which an operation mode is changed may finally have a threshold voltage distribution of the second erase state E2. In exemplary embodiments, the second erase state E2 may be an optimum threshold voltage distribution of erase state corresponding to the second operation mode MODE_2.

Unlike the method described with reference to FIG. 7, in the method illustrated in FIG. 10, after performing a normal erase operation on the basis of the first erase condition EC_1 corresponding to an operation mode of before the operation mode is changed, a re-erase operation is further performed based on the change erase condition EC_t.

Figure 11:
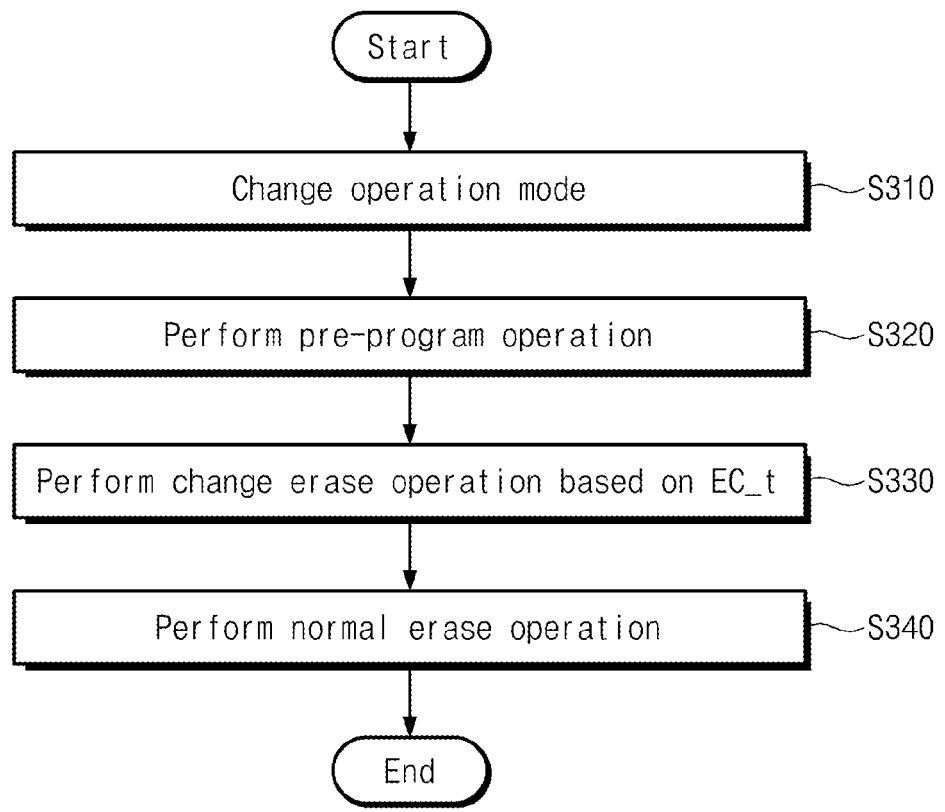
FIG. 11 is a flow chart illustrating an operation of a nonvolatile memory system in accordance with yet another embodiment of the inventive concept.

FIG. 11 is a flow chart illustrating an operation of a nonvolatile memory system in accordance with yet another embodiment of the inventive concept. Referring to FIGS. 1 and 11, in an operation S310, nonvolatile memory system 100 can change an operation mode. For example, nonvolatile memory system 100 can change an operation mode of a portion of the memory blocks that operate based on the first operation mode MODE_1 to the second operation mode MODE_2.

In an operation S320, nonvolatile memory system 100 performs a pre-program operation. For example, nonvolatile memory system 100 performs a pre-program operation on a memory block of which an operation mode is changed. The pre-program operation indicates an operation of programming memory cells included in memory blocks for which an operation mode is changed to have a pre-program state.

The pre-program state may be a program state having the threshold voltage distribution having the highest voltages among a plurality of program states corresponding to an operation mode before the operation mode is changed, or may have a threshold voltage distribution having voltages greater than the threshold voltage distribution having the highest voltages among the plurality of program states corresponding to an operation mode before the operation mode is changed. The pre-program state may be a program state having the threshold voltage distribution having the highest voltages among a plurality of program states included in each of the operation modes of memory device 120, or may be a program state having a threshold voltage distribution having threshold voltages greater than the program state having the highest threshold voltage distribution having the highest voltages among a plurality of program states included in each of the operation modes.

In an operation S330, nonvolatile memory system 100 performs a change erase operation on the basis of the change erase condition EC_t. For example, nonvolatile memory system 100 performs a change erase operation on memory blocks including memory cells having the pre-program state. After the change erase operation is completed, the memory cells included in the memory blocks may have an optimum erase state corresponding to a changed operation mode.

In an operation S340, nonvolatile memory system 100 can perform a normal erase operation. The operation S340 is the same as the operation S130 of FIG. 4.

Figure 12:
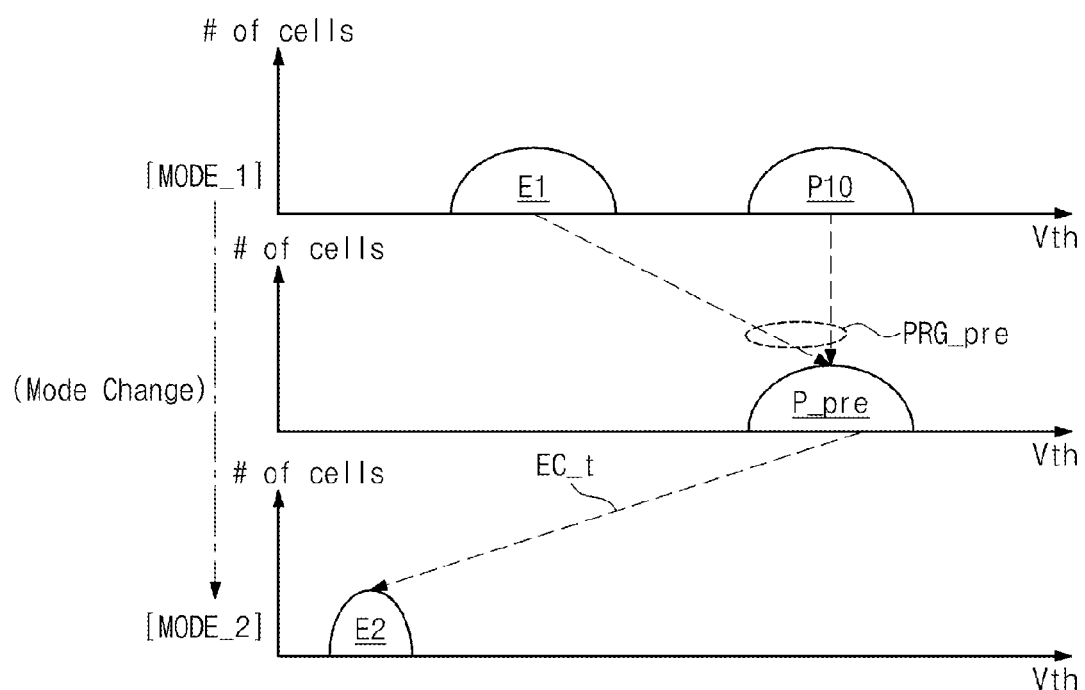
FIGS. 12 through 15 are drawings for explaining the operation of the nonvolatile memory system illustrated in FIG. 11.

FIGS. 12 to 15 are drawings for explaining the operation of the nonvolatile memory system illustrated in FIG. 11. Referring to FIGS. 1 and 12, nonvolatile memory system 100 can change an operation mode of a portion of the memory blocks that operate based on the first operation mode MODE_1 to the second operation mode MODE_2. Memory cells included in the memory blocks that operate based on the first operation mode MODE_1 may have one state of the first erase state E1 and the program state P10.

Nonvolatile memory system 100 performs a pre-program operation PRG_pre on memory cells included in the memory block(s) of which an operation mode is changed. The pre-programmed memory cells may have a pre-program state P_pre. The pre-program state P_pre may be the same as the program state P10 corresponding to an operation mode of memory device 120 before the operation mode is changed.

Nonvolatile memory system 100 performs a change erase operation on memory cells having the preprogram state P_pre on the basis of the change erase condition EC_t. Memory cells of which a change erase operation is completed may have the optimum second erase state E2 corresponding to the second operation mode MODE_2 (i.e., a changed operation mode).

Figure 13:
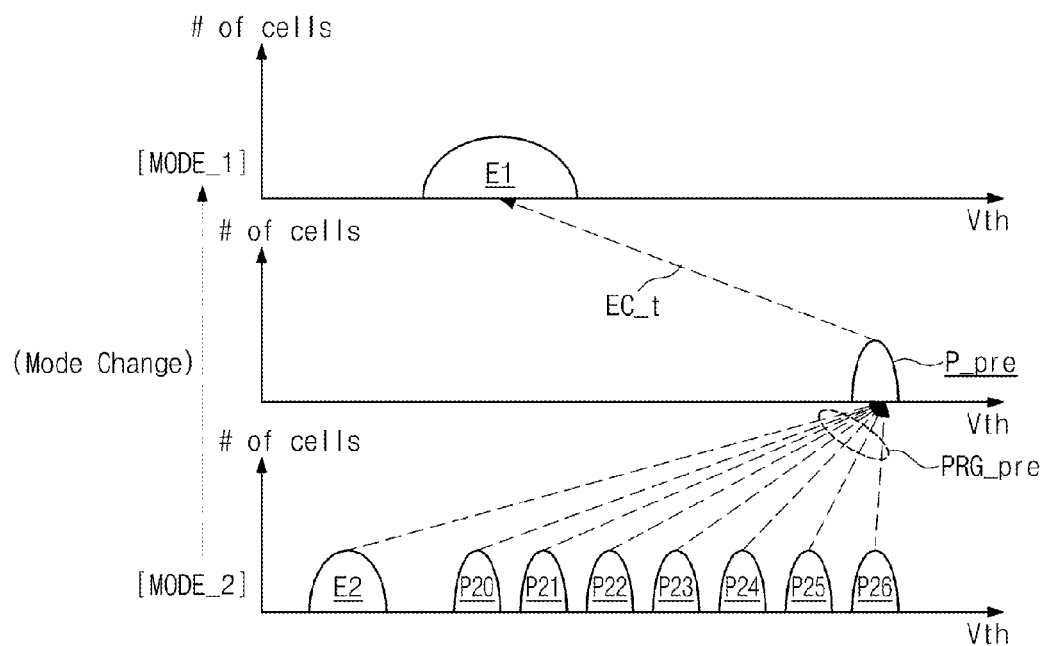

Referring to FIGS. 1 and 13, nonvolatile memory system 100 can change an operation mode of a portion of the memory blocks that operate based on the second operation mode MODE_2 to the first operation mode MODE_1. Memory cells included in the memory blocks that operate based on the second operation mode MODE_2 may have one of the second erase state E2 and the program states P20~P26.

Nonvolatile memory system 100 performs a preprogram operation PRG_pre on memory cells included in the memory block of which an operation mode is changed. The preprogrammed memory cells may have a preprogram state P_pre. The preprogram state P_pre may be the same as the program state P26 (a program state having a threshold voltage distribution with the greatest voltages among the program states included in the second operation mode MODE_2, which is an operation mode of the memory cells before the operation mode is changed).

Nonvolatile memory system 100 performs a change erase operation on memory cells having the preprogram state P_pre on the basis of the change erase condition EC_t. Memory cells of which a change erase operation is completed may have the optimum first erase state E1 corresponding to the first operation mode MODE_1 (i.e., a changed operation mode).

Figure 14:
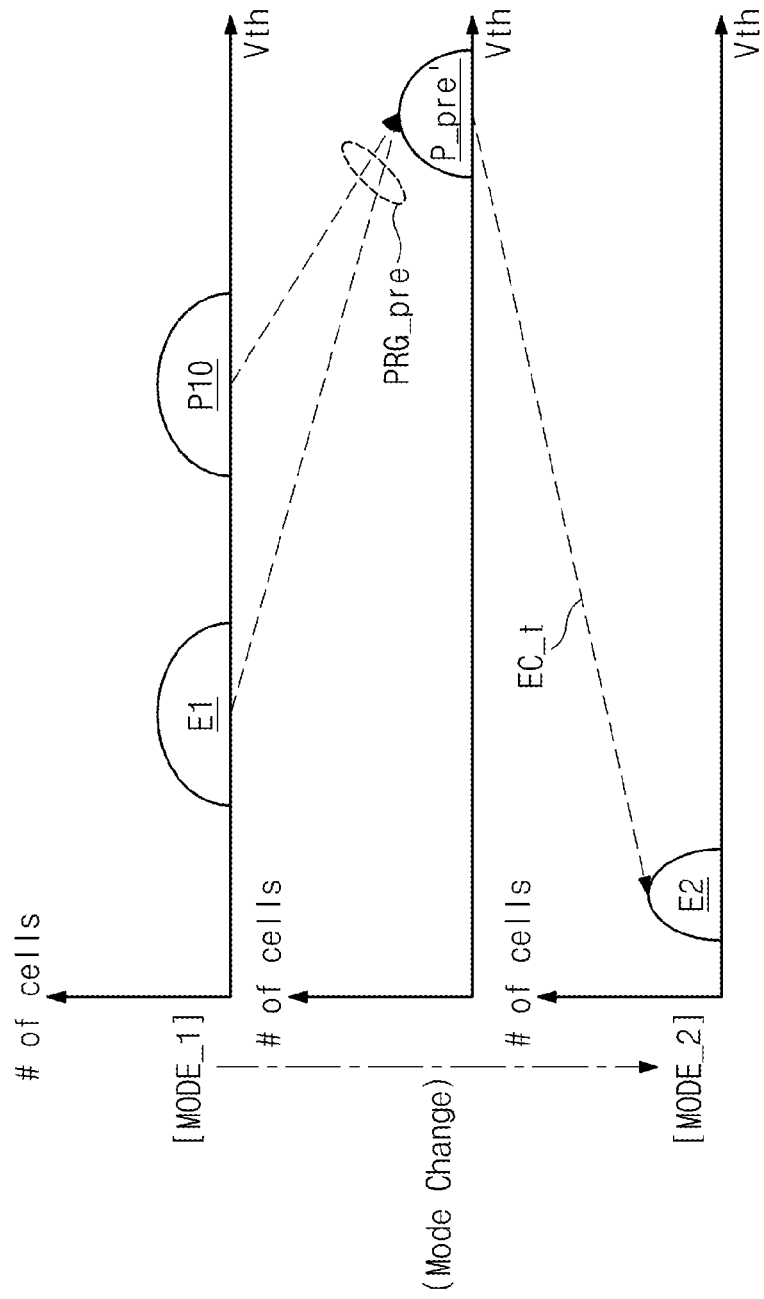

Referring to FIGS. 1 and 14, nonvolatile memory system 100 can change an operation mode of a portion of the memory blocks that operate based on the first operation mode MODE_1 to the second operation mode MODE_2. Memory cells included in the memory blocks that operate based on the first operation mode MODE_1 may have one of the first erase state E1 and the program state P10.

Nonvolatile memory system 100 performs a pre-program operation PRG_pre on memory cells included in the memory block of which an operation mode is changed. The pre-programmed memory cells may have a preprogram state P_pre'. The preprogram state P_pre' may be a state having a threshold voltage distribution having threshold voltages which are greater than the threshold voltage distribution of the program state P10 corresponding to the first operation mode MODE_1 (i.e., an operation mode of before the operation mode is changed).

Nonvolatile memory system 100 performs a change erase operation on memory cells having the pre-program state P_pre' on the basis of the change erase condition EC_t. Memory cells for which a change erase operation is completed may have the optimum second erase state E2 corresponding to the second operation mode MODE_2 (i.e., a changed operation mode).

Figure 15:
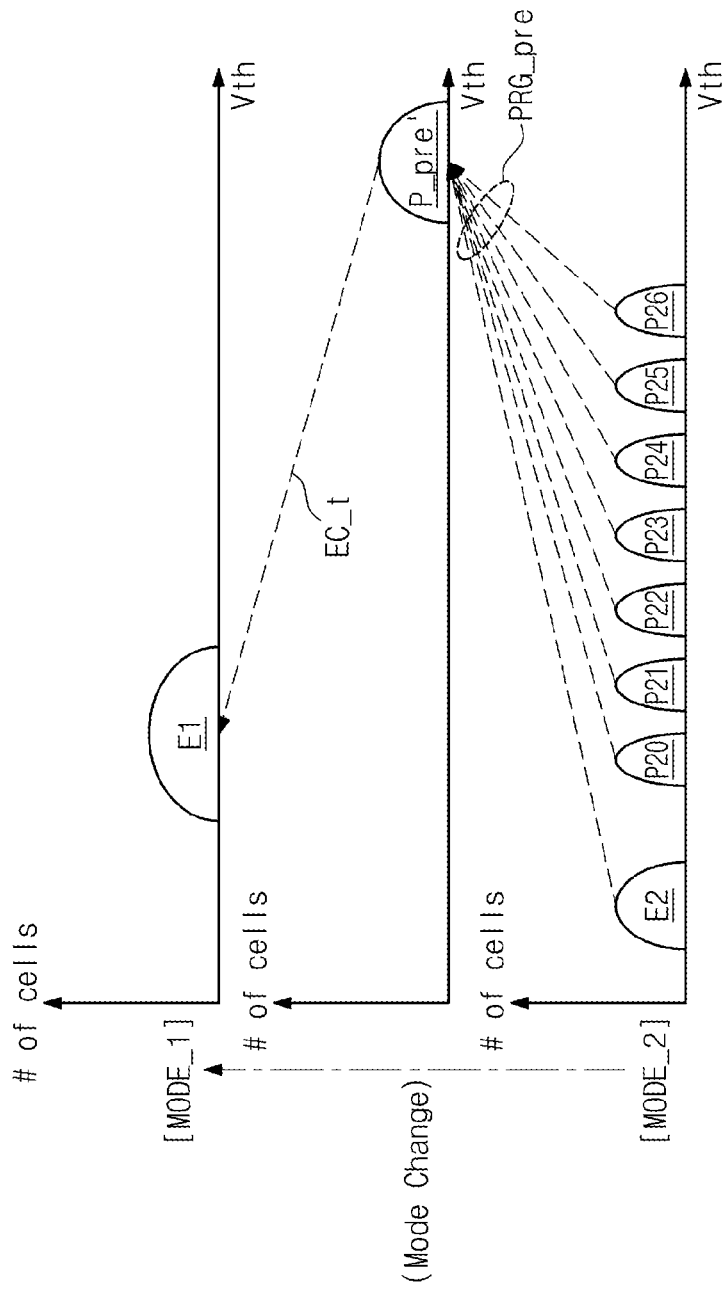

Referring to FIGS. 1 and 15, nonvolatile memory system 100 can change an operation mode of a portion of the memory blocks that operate based on the second operation mode MODE_2 to the first operation mode MODE_1. Memory cells included in the memory blocks that operate based on the second operation mode MODE_2 may have one of the second erase state E2 and the program states P20~P26.

Nonvolatile memory system 100 performs a pre-program operation PRG_pre on memory cells included in the memory block of which an operation mode is changed. The pre-programmed memory cells may have a preprogram state P_pre'. The pre-program state P_pre' may be a program state having a threshold voltage distribution having threshold voltages which are greater than the threshold voltages of the threshold distribution for the program state P26 (a program state having the threshold voltage distribution with the greatest voltages among the program states included in the second operation mode MODE_2, which is an operation mode of memory device 120 before the operation mode is changed).

Nonvolatile memory system 100 performs a change erase operation on memory cells having the pre-program state P_pre' on the basis of the change erase condition EC_t. Memory cells of which a change erase operation is completed may have the optimum erase state E1 corresponding to the first operation mode MODE_1 (i.e., a changed operation mode).

The pre-program state P_pre' illustrated in FIGS. 14 and 15 may have the same threshold voltage distribution. That is, in the case that nonvolatile memory system 100 operates based on a plurality of operation modes, the pre-program state P_pre' may be a state having a threshold voltage distribution having threshold voltages which are greater than a program state having the threshold voltage distribution with the greatest threshold voltages among a plurality of program states included each of the operation modes.

According to still another embodiment of the inventive concept, when an operation is changed, nonvolatile memory system 100 performs a pre-program operation, and then performs a change erase operation. Thus, since memory cells included in memory blocks of which an operation mode is changed have an optimum erase state corresponding to the changed operation mode, a nonvolatile memory system having improved reliability may be provided.

Figure 16:
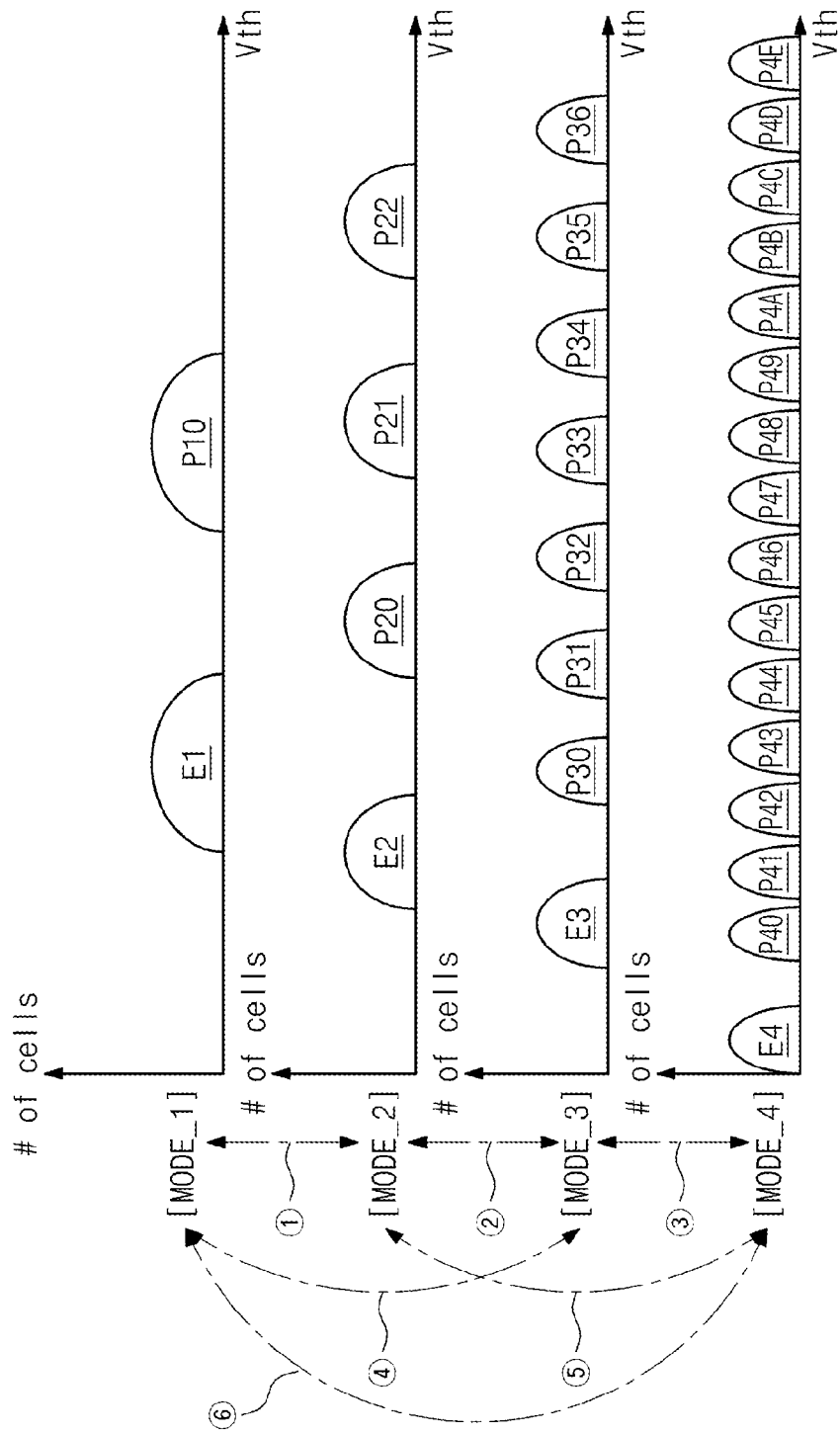
FIG. 16 is a drawing illustrating a threshold voltage distribution of a plurality of operation modes in accordance with an embodiment of the inventive concept.

FIG. 16 is a drawing illustrating a threshold voltage distribution of a plurality of operation modes in accordance with an embodiment of the inventive concept. Referring to FIGS. 1 and 16, nonvolatile memory system 100 can operate based on first through fourth operation modes MODE_1 to MODE4. For example, memory cell array 121 may include a plurality of memory blocks. Each of the memory blocks can operate at one of the first to fourth operation modes MODE_1 to MODE_4. Nonvolatile memory system 100 can change an operation mode of the memory blocks.

Memory cells included in the memory blocks that operate based on the first operation mode MODE_1 may have one of the first erase state E1 and the program state P10. The first operation mode MODE_1 may indicate a single level cell (SLC) wherein one memory cell stores 1-bit data.

Memory cells included in the memory blocks that operate based on the second operation mode MODE_2 may have one of the second erase state E2 and the program states P20~P22. The second operation mode MODE_2 may indicate a multi level cell (MLC) wherein one memory cell stores 2-bit data.

Memory cells included in the memory blocks that operate based on the third operation mode MODE_3 may have one of the second erase state E3 and the program states P30~P36. The third operation mode MODE_3 may indicate a triple level cell (TLC) wherein one memory cell stores 3-bit data.

Memory cells included in the memory blocks that operate based on the fourth operation mode MODE_4 may have one of the fourth erase state E4 and the program states P40~P4E. The fourth operation mode MODE_4 may indicate a quarter level cell (QLC) wherein one memory cell stores 4-bit data.

Nonvolatile memory system 100 can perform a normal erase operation on each of the first to fourth operation modes MODE_1 to MODE_4 on the basis of first to fourth erase conditions respectively. In the case that at least one operation mode of memory blocks is changed, nonvolatile memory system 100 performs a change erase operation on the basis of the change erase condition EC_t so that an erase state of memory cells of a memory block, of which an operation mode is changed, has an optimum threshold voltage distribution corresponding to the changed operation mode in which the memory cells are operated going forward. For example, in the case that an operation mode of a memory block is changed from the first operation mode MODE_1 to the fourth operation mode MODE_4, the nonvolatile memory system 100 erases a memory block on the basis of the change erase condition EC_t so that memory cells, having the first erase state E1 and the program state P10, have a threshold voltage distribution of the fourth erase state E4.

A change erase condition may include a variety of erase parameters. The change erase condition EC_t may create an erase state corresponding to a changed operation mode have an optimum threshold voltage distribution by making an erase verification voltage, an erase voltage and the number of times that an erase loop is repeated for the change erase condition different from an erase verification voltage, an erase voltage and the number of times that an erase loop is repeated for the first to fourth erase conditions.

Change erase parameters may be different from one another with respect to each of an operation mode changes: ① between the first and second operation modes; ② between the second and third operation modes; ③ between the third and second fourth modes; ④ between the first and third operation modes; ⑤ between the second and fourth operation modes; and ⑥ between the first and fourth operation modes.

In addition, it is assumed that nonvolatile memory system 100 operates based on the first to fourth operation modes MODE_1 to MODE_4. However, the inventive concept is not limited to this example. According to the embodiments of the inventive concept, nonvolatile memory system 100 can operate based on a plurality of operation modes. Nonvolatile memory system 100 can perform an erase operation, a change erase operation, a re-erase operation, or a pre-program operation in units of a memory block, a sub block, a page or a memory cell unit. An operation mode of nonvolatile memory system 100 can be applied on the basis of units of nonvolatile memory device 120 described above.

If an operation mode is changed, nonvolatile memory system 100 can perform a change erase operation, a re-erase operation, or pre-program operation on the basis of the operation methods described with reference to FIGS. 1 through 15.

The pre-program state P_pre (refer to FIGS. 14 and 15) may be the same with the program state P4E of the fourth operation mode, or may have a threshold voltage distribution with threshold voltages which are greater than the threshold voltages of the threshold distribution the program state P4E.

According to the embodiments of the inventive concept described above, in the case that an operation mode of nonvolatile memory system 100 is changed, nonvolatile memory system 100 performs a change erase operation on the basis of a change erase condition. The change erase condition indicates an erase condition wherein an erase state corresponding to a changed operation mode becomes an optimum threshold voltage distribution. Thus, a nonvolatile memory system having improved reliability may be provided.

Figure 17:
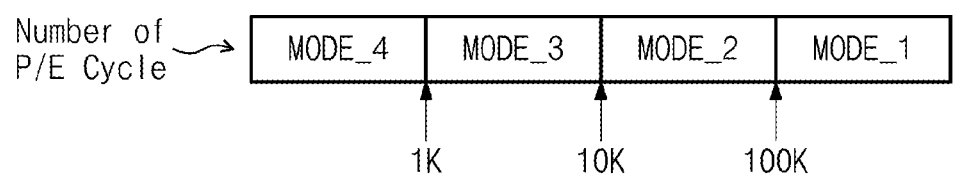
FIG. 17 is a drawing for explaining an operation of a nonvolatile memory system in accordance with another embodiment of the inventive concept.

FIG. 17 is a drawing for explaining an operation of a nonvolatile memory system in accordance with another embodiment of the inventive concept. Referring to FIGS. 1 and 17, nonvolatile memory system 100 can change an operation mode for one or more memory cells of memory device 120 on the basis of the number of program & erase cycles which have been performed (hereinafter it is referred to as P/E cycles) on those memory cells. For example, nonvolatile memory system 100 can operate based on the fourth operation mode MODE_4 (for example, QLC) until the number of P/E cycles reaches a first reference value 1 k.

In the case that the number of P/E cycles exceeds the first reference value (e.g., 1 k or 1000), nonvolatile memory system 100 can change an operation to the third operation mode MODE_3 (for example, TLC). After that, nonvolatile memory system 100 can maintain the third operation mode MODE_3 until the number of P/E cycles reaches a second reference value (e.g., 10 k or 10,000).

In the case that the number of P/E cycles exceeds the second reference value, nonvolatile memory system 100 can change an operation to the second operation mode MODE_2 (for example, MLC). After that, nonvolatile memory system 100 can maintain the second operation mode MODE_2 until the number of P/E cycles reaches a third reference value (e.g., 100 k or 100,000).

In the case that the number of P/E cycles exceeds the third reference value, nonvolatile memory system 100 can change an operation mode to the first operation mode MODE_1 (for example, SLC).

The first to fourth operation modes MODE_1 to MODE_4 may have different storage capacities and reliability respectively. For example, the fourth operation mode MODE_4 can store the greatest number of data bits in one cell compared with other operation modes MODE_1~MODE_3 but deterioration of memory cells is most severe and memory cells have the lowest reliability. On the contrary, the first operation mode MODE_1 can store the least number of data bits in one memory cell compared with other operation modes MODE_2~MODE_4, but deterioration of memory cells is smallest and memory cells have the highest reliability in the first operation mode MODE_1.

As the number of P/E cycles increase, a data storage capacity is reduced but nonvolatile memory system 100 changes an operation mode in the direction that deterioration of memory cells is reduced and reliability of memory cells is improved. Thus, the life and reliability of the nonvolatile memory system may be improved.

In exemplary embodiments, when an operation mode for at least one of memory blocks in nonvolatile memory device 100 is changed, nonvolatile memory system 100 can perform a change erase operation on the basis of the change erase condition described with reference to FIGS. 1 through 16.

Figure 18:
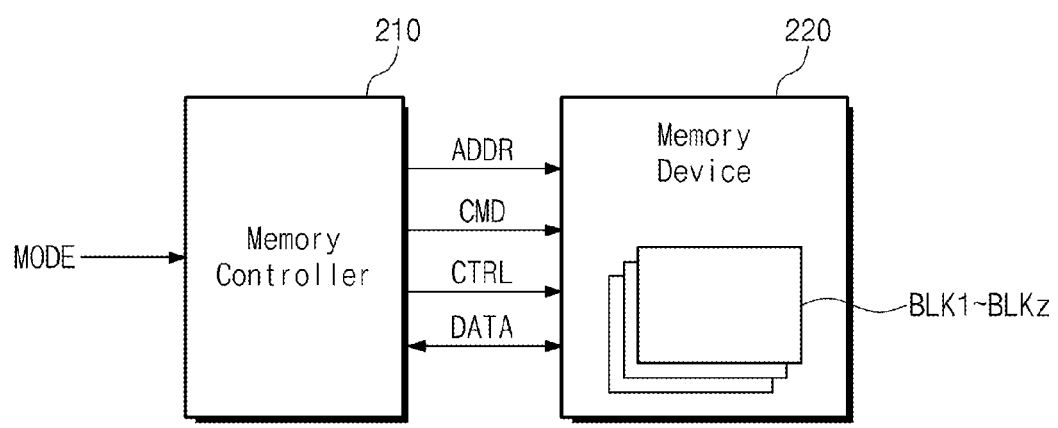
FIG. 18 is a block diagram illustrating a nonvolatile memory system in accordance with another embodiment of the inventive concept.

FIG. 18 is a block diagram illustrating a nonvolatile memory system in accordance with another embodiment of the inventive concept. Referring to FIG. 18, a nonvolatile memory system 200 includes a memory controller 210 and a nonvolatile memory device 220. Since basic operations of controller 210 and nonvolatile memory device 220 are as described with reference to controller 110 and memory device 120 of FIG. 1, a detailed description is omitted.

Memory controller 210 can receive an operation mode control signal MODE from an external device (e.g., a host, Application Processor (AP), etc.). The operation mode control signal MODE may be a signal controlling an operation mode of nonvolatile memory system 200. Memory controller 210 can control an operation mode of nonvolatile memory system 200 in response to the received operation mode command or control signal MODE. For example, nonvolatile memory system 200 can operate based on the first to fourth operation modes MODE_1 to MODE_4. The operation mode control signal MODE may include storage capacity information and operation mode information corresponding to any one of the first to fourth operation modes MODE_1 to MODE_4. Memory controller 210 can change an operation mode of a memory capacity corresponding to the storage capacity information on the basis of the storage capacity information and the operation mode information in response to the received operation mode control signal MODE. In exemplary embodiments, the storage capacity information indicates information for memory cells that the operation mode is changed among a plurality of memory cells or information for memory blocks that the operation mode is changed among a plurality of memory blocks.

Memory controller 210 can transmit a control signal CTRL to nonvolatile memory device 220. The control signal CTRL may include operation mode change information. Nonvolatile memory device 220 can control an operation mode of one or more of a plurality of memory blocks of memory device 220 in response to the received control signal CTRL so that the operation mode of the memory blocks becomes an operation mode corresponding to the operation mode change information. In this case, nonvolatile memory device 220 performs a change erase operation on the basis of a change erase condition in response to the received control signal CTRL.

In exemplary embodiments, a user can change an operation mode of nonvolatile memory system 200 to suit a purpose of use of nonvolatile memory system 200. For example, a high operational speed, a small capacity and high reliability may be obtained in the order of first, second, third and fourth operation modes MODE_1, MODE_2, MODE_3 and MODE_4. In the case that a high operation speed and high reliability of nonvolatile memory system 200 are required, a user can set an operation mode so that nonvolatile memory system 200 operates based on the first operation mode MODE_1. On the other hand, in the case that a large capacity of nonvolatile memory system 200 is required, a user can set an operation mode so that nonvolatile memory system 200 operates based on the fourth operation mode MODE_4. The operation mode control signal MODE can be generated based on an operation mode set by a user.

In the case that nonvolatile memory system 200 changes an operation mode according to the operation mode control signal MODE, a change erase operation can be performed based on an erase method described with reference to FIGS. 1 to 16. Nonvolatile memory system 200 performs a change erase operation on the basis of a change erase condition so that an erase state corresponding to an operation mode to which the cells are to be changed has an optimum threshold voltage distribution and thereby a nonvolatile memory system having improved reliability may be provided.

Memory controller 210 can perform a wear leveling function by giving different weights to the different operation modes respectively. For example, a weight leveling for the first operation mode MODE_1 may be different from a weight leveling for the third operation mode MODE_3. That is, a weight leveling for a case that the number of P/E cycles, in the first operation mode MODE_1 is, e.g., 1 k, may be different from a weight leveling for a case that the number of P/E cycles in the third operation mode MODE_3, is, e.g., 1 k.

Memory controller 210 can give different weights to the first to fourth operation modes MODE_1 to MODE_4 respectively. Table 1 below shows weights with respect to the first to fourth operation modes MODE_1 to MODE_4, respectively.

TABLE 1

| | MODE | | | |
|---|---|---|---|---|
| | MODE_1 | MODE_2 | MODE_3 | MODE_4 |
| Weight | a | b | c | d |
| The number of cycles to which a weight is given | a * P/E | b * P/E | c * P/E | d * P/E |

Referring to Table 1, a, b, c, and d indicate weights with respect to the first to fourth operation modes MODE_1 to MODE_4 respectively. A weight a of the first operation mode MODE_1 may be smaller than other weights b, c and d. A weight d of the fourth operation MODE_4 may be greater than other weights a, b and c. Since memory cells that operate based on the fourth operation mode MODE_4 stores the greatest number of data bits in one memory cell, the memory cells may be most rapidly deteriorated. Thus, a wear level with respect to the operation modes may be standardized by giving different weights to the operation modes respectively on the basis of the operation modes.

For example, in the case that a first memory block operates the number of P/E cycles of 1 k based on the third operation mode MODE_3 after it operates the number of P/E cycles of 1 k based on the first operation mode MODE_1, the accumulated number of P/E cycles may be (a*1 k+c*1 k). Since memory controller 210 performs a wear leveling on the basis of the number of P/E cycles applied to the weights corresponding to a plurality of operation modes, a nonvolatile memory system having improved reliability is provided.

In exemplary embodiments, an operation (e.g., an operation mode control, a wear leveling by applying weights corresponding to a plurality of operation modes) of memory controller 210 may be performed in a FTL (111, referring to FIG. 2).

According to the still another embodiment of the inventive concept, nonvolatile memory system 200 can change an operation mode under the control of an external device. When an operation mode is changed, nonvolatile memory system 200 can perform an erase operation so that an erase state corresponding to an operation to which the cells are to be changed has an optimum threshold voltage distribution.

Memory controller 210 can standardize wear volumes with respect to the operation modes by giving different weights to the different operation modes, respectively. Memory controller 210 performs a wear leveling on the basis of the standardized wear volume and thereby a nonvolatile memory system having improved reliability may be provided.

Figure 19:
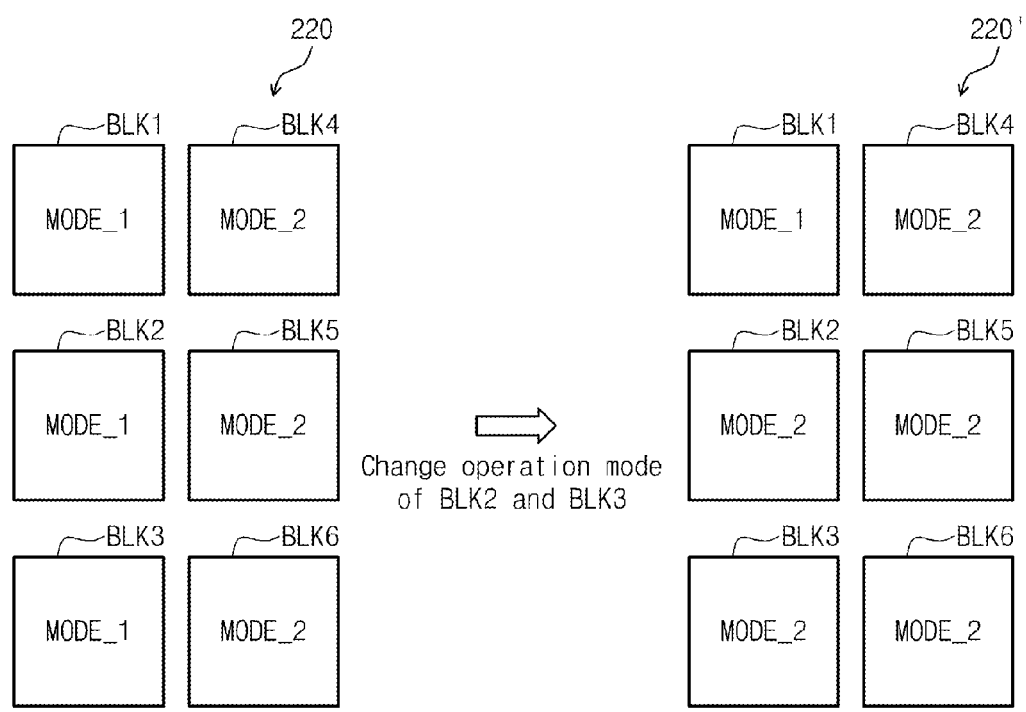
FIG. 19 is a drawing for explaining an example operation of an embodiment of the nonvolatile memory system illustrated in FIG. 18.

FIG. 19 is a drawing for explaining an example operation of an embodiment of the nonvolatile memory system illustrated in FIG. 18. It is assumed that a memory cell array 211 illustrated in FIG. 19 includes first through sixth blocks BLK1~BLK6. It is assumed that the first through third blocks BLK1~BLK3 operate based on the first operation mode MODE_1 and the fourth through sixth blocks BLK4~BLK6 operate based on the second operation mode MODE_2. However, the inventive concept is not limited to this example. The number of memory blocks included in memory cell array 211 may increase or decrease.

Referring to FIGS. 18 and 19, the first to third blocks BLK1 to BLK3 operate based on the first operation mode MODE_1 and the fourth to sixth blocks BLK4 to BLK6 operate based on the second operation mode MODE_2.

As described with reference to FIG. 18, memory controller 210 can control an operation mode of the memory blocks. For example, memory controller 210 receives an operation mode control signal MODE and can change operation modes of the second and third blocks BLK2 and BLK3 to the second operation mode MODE_2 in response to the received operation mode control signal MODE. An operation mode change of memory controller 210 may be performed in a FTL. Nonvolatile memory device 220 can perform the erase operation described with reference to FIGS. 1 to 16 on the second and third blocks BLK2 and BLK3 of which operation modes are changed. For example, nonvolatile memory device 220 can erase the second and third blocks BLK2 and BLK3 of which operation modes are changed on the basis of the change erase condition EC_t.

Figure 20:
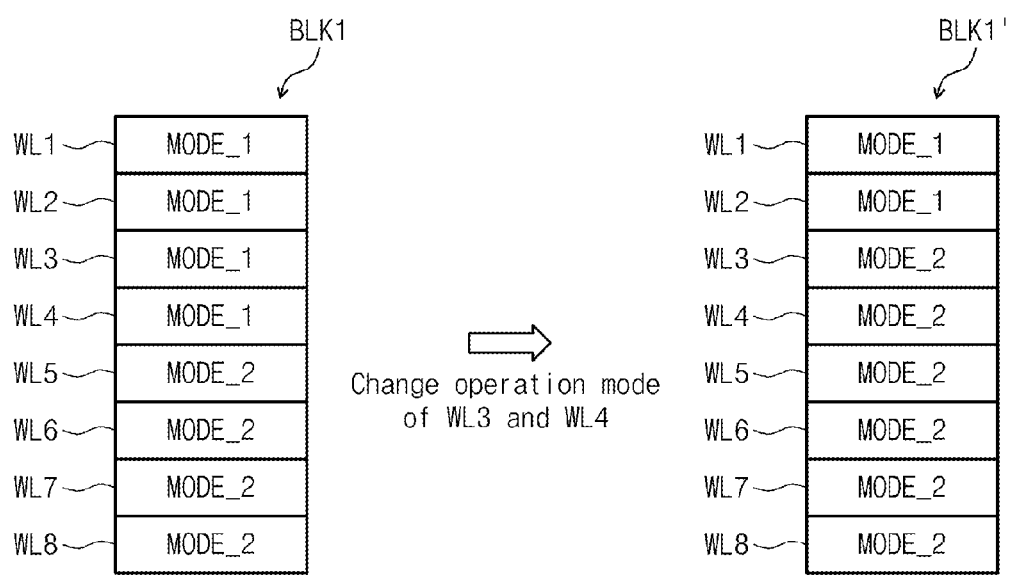
FIG. 20 is a drawing for explaining another example operation of an embodiment of the nonvolatile memory system illustrated in FIG. 18.

FIG. 20 is a drawing for explaining another example operation of an embodiment of the nonvolatile memory system illustrated in FIG. 18. It is assumed that the first memory block BLK1 illustrated in FIG. 20 includes first to eighth word lines WL1 to WL8. It is also assumed that the first to eighth word lines WL1 to WL8 operate based on the first and second operation modes MODE_1 and MODE_2. However, the inventive concept is not limited to this example. A plurality of word lines may operate based on a plurality of operation modes.

Referring to FIGS. 18 and 20, the first memory block BLK1 of the memory cell array 211 may include the first to eighth word lines WL1 to WL8. The first to fourth word lines WL1 to WL4 operate based on the first operation mode MODE_1 and the fifth to eighth word lines WL5 to WL8 operate based on the second operation mode MODE_2.

As described with reference to FIG. 18, memory controller 210 can control an operation mode with respect to the first to eighth word lines WL1 to WL8. For example, memory controller 210 receives the operation mode control signal MODE from an external device and can change operation modes of the third and fourth word lines WL3 and WL4 to the second operation mode MODE_2 in response to the received operation mode control signal MODE. In exemplary embodiments, an operation mode change of memory controller 210 can be performed in a FTL.

Nonvolatile memory device 220 can erase the third and fourth word lines WL3 and WL4 of which operation modes are changed according to the method described with reference to FIGS. 1 to 16. For example, nonvolatile memory device 220 can erase the third and fourth word lines WL3 and WL4 on the basis of change erase condition EC_t.

As described with reference to FIGS. 19 and 20, the nonvolatile memory system according to the embodiments of the inventive concept can control an operation mode by a memory block unit or a word line unit. In the case that an operation mode is changed, the change erase condition is applied to perform an erase operation. However, the inventive concept is not limited to this example. The nonvolatile memory system can control an operation mode on the basis of an erase unit. The erase unit may correspond to a memory block, a sub block, a word line, a page or a memory cell.

Figure 21:
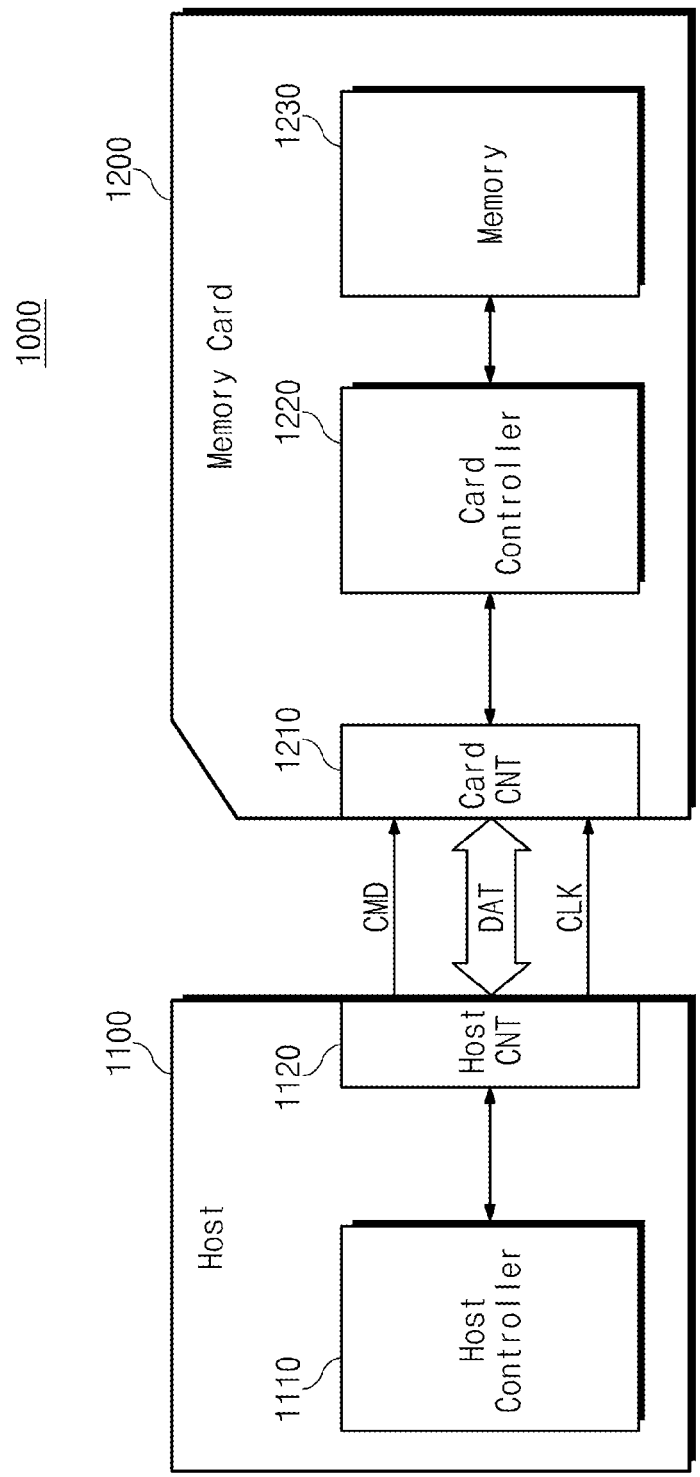
FIG. 21 illustrates an example of applying a nonvolatile memory system in accordance with an embodiment of the inventive concept to a memory card.

FIG. 21 illustrates an example of applying a nonvolatile memory system in accordance with an embodiment of the inventive concept to a memory card. Referring to FIG. 21, a memory card system 1000 includes a host 1100 and a memory card 1200. Host 1100 includes a host controller 1110 and a host connection unit 1120. Memory card 1200 includes a card connection unit 1210, a card controller 1220 and a memory (e.g., a flash memory) 1230. Memory card 1200 can be embodied by the nonvolatile memory system described with reference to FIGS. 1 to 20.

Host 1100 writes data in memory card 1200 or reads data stored in the memory card 1200. Host controller 1110 transmits a command (e.g., a read command), a clock signal CLK generated from a clock generator (not shown) in host 1100, and data DATA to memory card 1200 through host connection unit 1120.

Card controller 1220 stores data in flash memory 1230 in synchronization with the clock signal generated from the clock generator (not shown) in response to the command received through card connection unit 1210. Flash memory 1230 stores data transmitted from host 1100. For example, in the case that host 1100 is a digital camera, flash memory 1230 stores image data.

Figure 22:
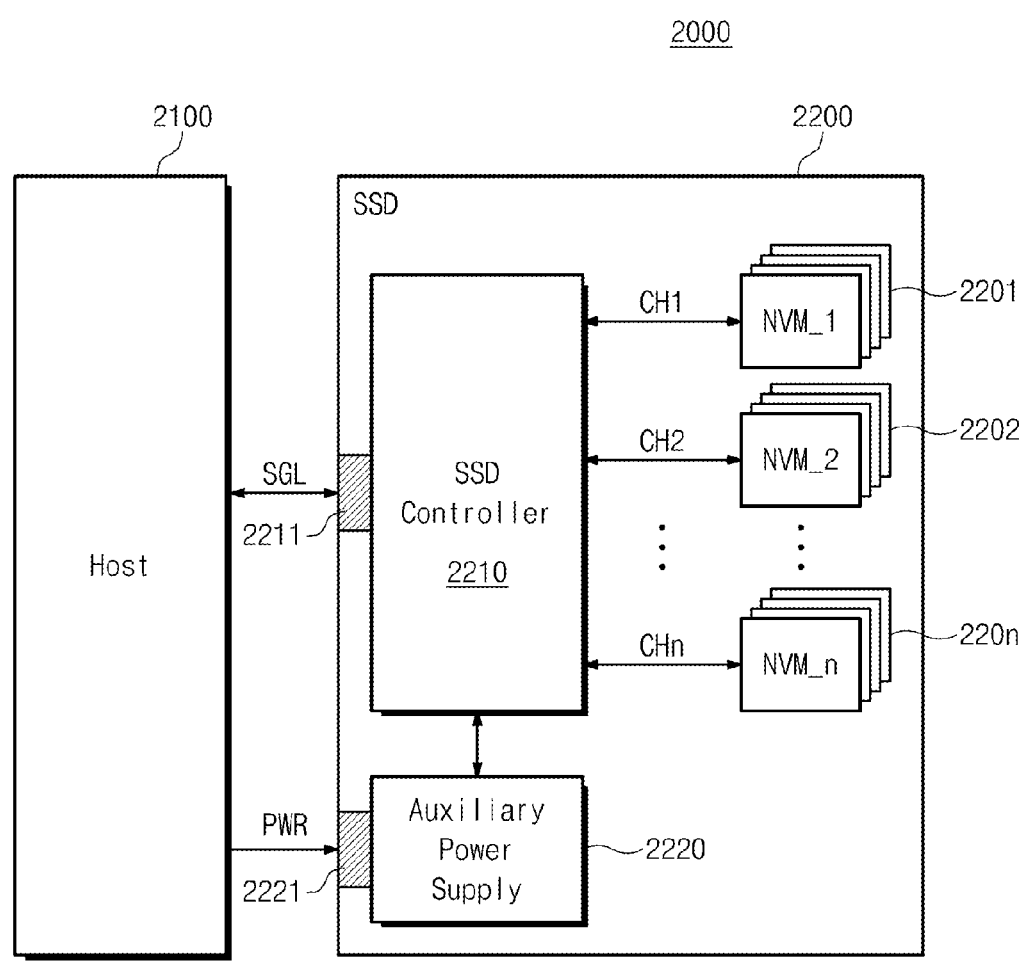
FIG. 22 is a block diagram illustrating an example of applying a nonvolatile memory system in accordance with an embodiment of the inventive concept to a solid state drive (SSD).

FIG. 22 is a block diagram illustrating an example of applying a nonvolatile memory system in accordance with an embodiment of the inventive concept to a solid state drive (SSD). Referring to FIG. 22, a SSD system 2000 includes a host 2100 and a SSD 2200.

SSD 2200 exchanges a signal with host 2100 through a signal connector 2211 and receives power through a power connector 2221. SSD 2200 may include a plurality of nonvolatile memories (NVM_1, NVM_2, . . . NVM_n) 2201~220n, an SSD controller 2210 and an auxiliary power supply 2220.

Nonvolatile memories 2201~220n are used as a storage medium of SSD 2200. In exemplary embodiments, nonvolatile memories may be provided as a flash memories and/or may include another nonvolatile memory device such as a PRAM, a MRAM, an ReRAM, a FRAM, and so on. Nonvolatile memories 2201~220n can be connected to SSD controller 2210 through a plurality of channels CH1~CHn. One or more nonvolatile memories may be connected to one channel. Nonvolatile memories connected to one channel can be connected to a same data bus.

SSD controller 2210 exchanges a signal SGL with host 2100 through signal connector 2211. The signal SGL includes a command, an address, data, etc. SSD controller 2210 writes data in a corresponding flash memory or reads data from a corresponding nonvolatile memory according to a command of host 2100.

Auxiliary power supply 2220 is connected to host 2100 through power connector 2221. Auxiliary power supply 2220 can receive power from host 2100, and may be charged. Auxiliary power supply 2220 may be located inside or outside SSD 2200. For example, auxiliary power supply 2220 may be located on a main board to provide auxiliary power to SSD 2200.

Figure 23:
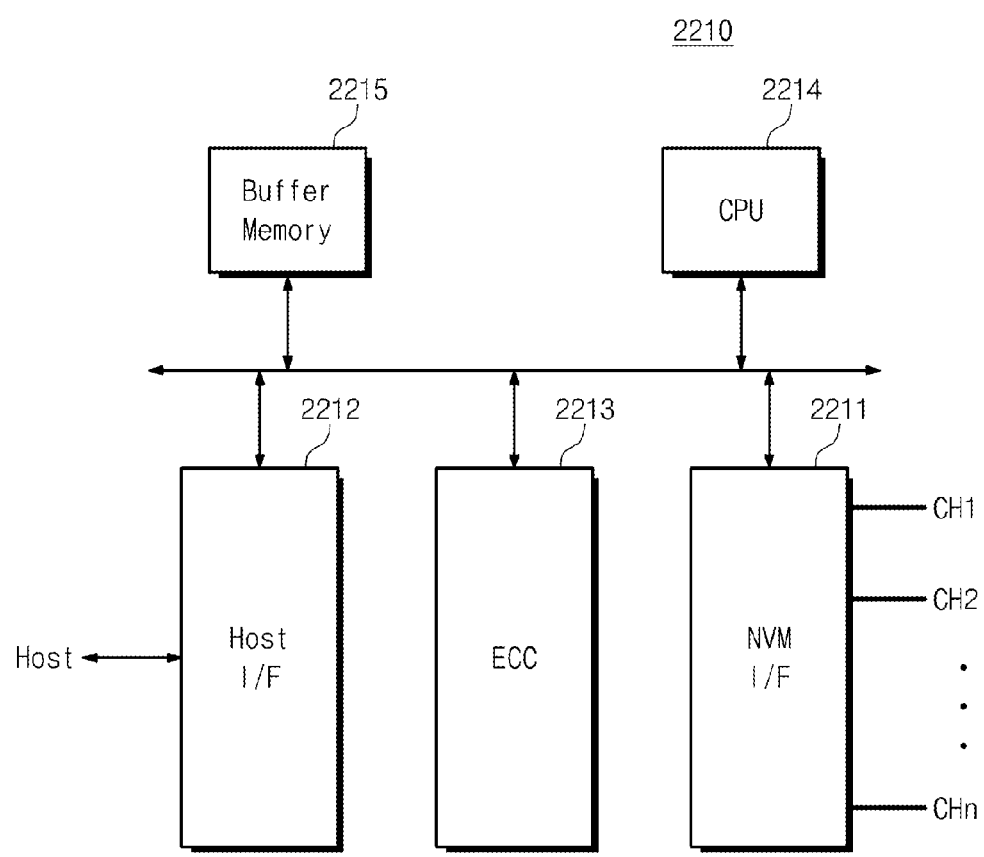
FIG. 23 is a block diagram illustrating a constitution of an embodiment of an SSD controller illustrated in FIG. 22.

FIG. 23 is a block diagram illustrating a constitution of an example embodiment of an SSD controller illustrated in FIG. 22. Referring to FIG. 23, SSD controller 2210 includes a NVM interface 2211, a host interface 2212, an ECC circuit 2213, a central processing unit (CPU) 2214 and a buffer memory 2215.

NVM interface 2211 distributes data transmitted from buffer memory 2215 to respective channels CH1~CHn. NVM interface 2211 transmits data read from flash memories 2201~220n to buffer memory 2215. NVM interface 2211 can use an interface method of a flash memory. SSD controller 2210 can perform a program, read or erase operation according to the interface method of a flash memory.

Host interface 2212 provides an interface with SSD 2200 in response to a protocol of host 2100. Host interface 2212 can communicate with host 2100 using a universal serial bus (USB), a small computer system interface (SCSI), a PCI express, an ATA, a serial ATA, a parallel ATA, a serial attached SCSI (SAS), a universal flash storage (UFS), NVM-e (Nonvolatile Memory-Express). Host interface 2212 can also perform a disk emulation function so that host 2100 recognizes SSD 2200 as a hard disk drive (HDD).

ECC circuit 2213 generates an error correction code (ECC) using data being transmitted to nonvolatile memories 2201~220n. The generated error correction code is stored in a spare area of nonvolatile memories 2201~220n. ECC circuit 2213 detects an error of data read from nonvolatile memories 2201~220n. If the detected error is within a correction capacity, ECC circuit 2213 corrects the detected error.

Central processing unit (CPU) 2214 analyzes and processes a signal SGL input from host 2100. CPU 2214 controls host 2100 and nonvolatile memories 2201~220n through host interface 2212 and NVM interface 2211. CPU 2214 controls an operation of nonvolatile memories 2201~220n according to a firmware for driving SSD 2200.

CPU 2214 can be configured to control a plurality of operation modes as described with reference to FIGS. 1 to 20.

Buffer memory 2215 temporarily stores write data being provided from host 2100 or data read from a nonvolatile memory. Buffer memory 2215 can store mesh data or cache data to be stored in nonvolatile memories 2201~220n. When a sudden power off operation is performed, meta data or cache data stored in buffer memory 2215 is stored in nonvolatile memories 2201~220n. Buffer memory 2215 may include DRAM, SRAM, etc.

Figure 24:
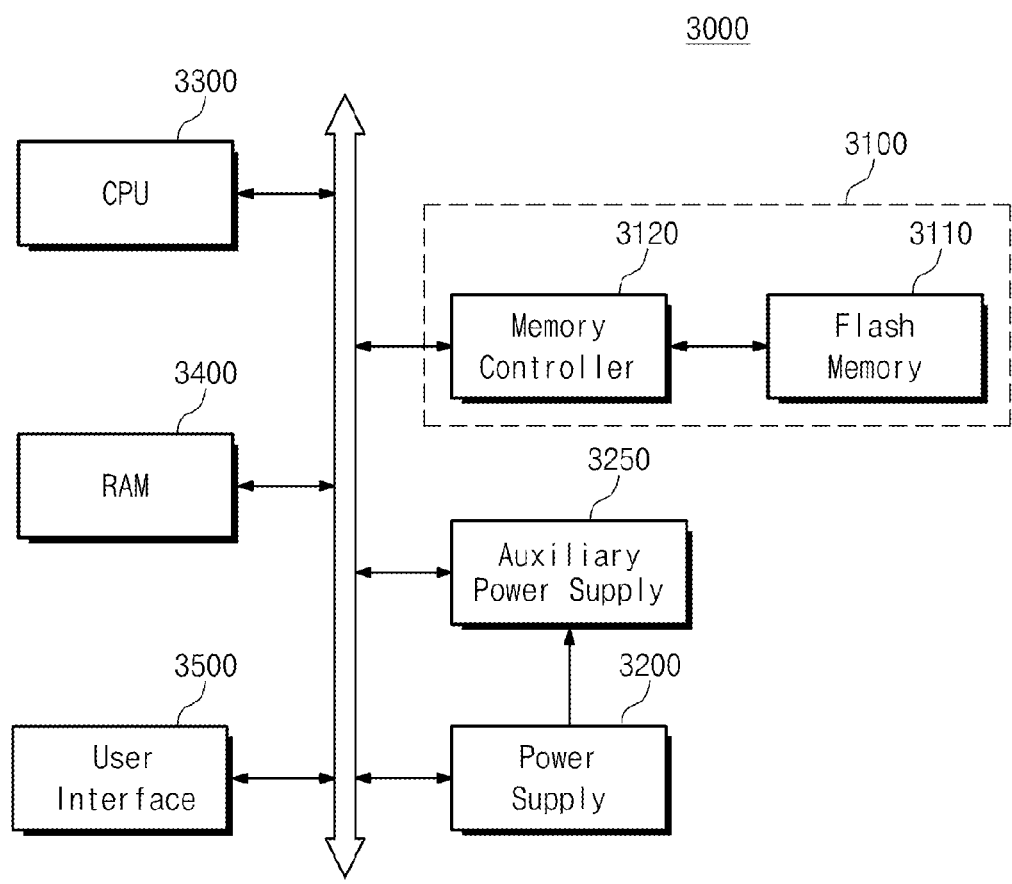
FIG. 24 is a block diagram illustrating an example of realizing a data storage device in accordance with an embodiment of the inventive concept by an electronic device.

FIG. 24 is a block diagram illustrating an example of realizing a data storage device in accordance with an embodiment of the inventive concept by an electronic device. An electronic device 3000 may be provided as one of computing systems such as an ultra mobile PC (UMPC), a workstation, a netbook, a personal digital assistant (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, etc.

Referring to FIG. 24, electronic device 3000 includes a memory system 3100, a power supply 3200, an auxiliary power supply 3250, a central processing unit (CPU) 3300, a RAM 3400, and a user interface 3500. Memory system 3100 includes a flash memory 3110 and a memory controller 3120. Flash memory 3110 may be a nonvolatile memory device described with reference to FIGS. 1 to 20.

In exemplary embodiments, the memory system may operate based on an operating method described with reference to FIGS. 1 to 20.

Figure 25:
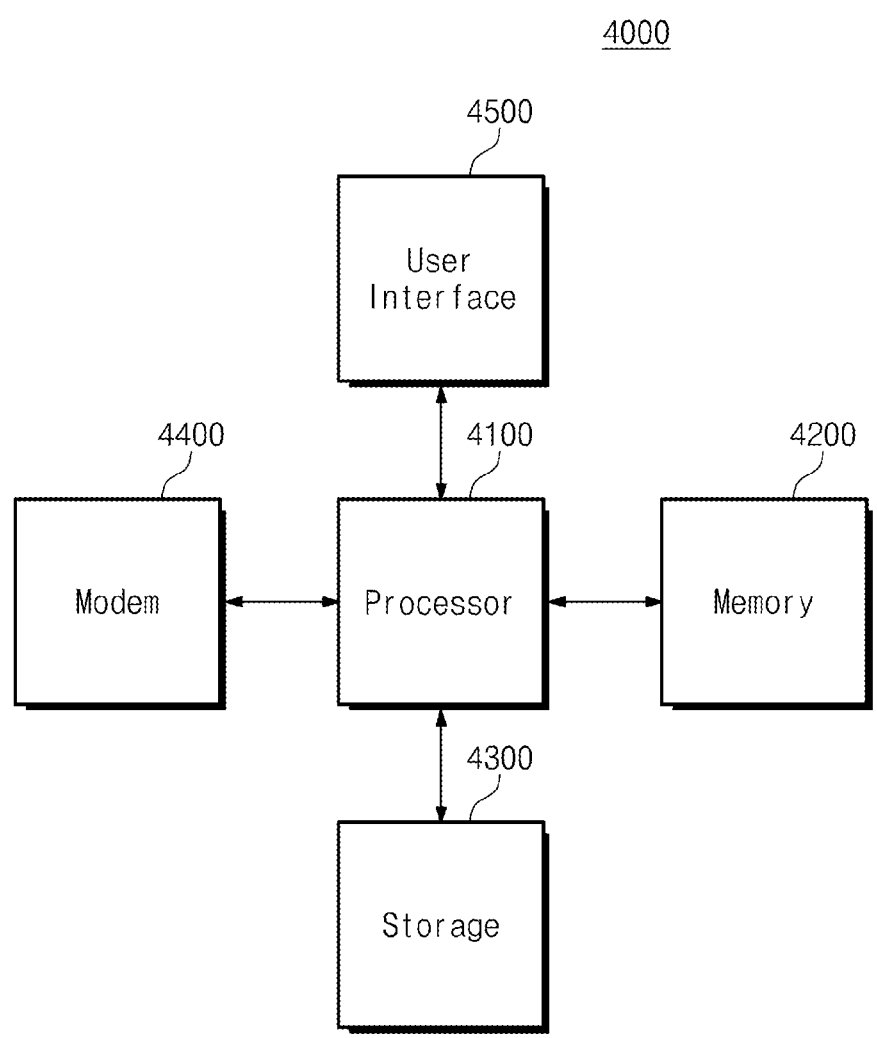
FIG. 25 is a block diagram illustrating a mobile system to which a nonvolatile memory device of the inventive concept is applied.

FIG. 25 is a block diagram illustrating a mobile system to which a nonvolatile memory device of the inventive concept is applied. Referring to FIG. 25, a mobile system 4000 includes a processor 4100, a memory 4200, storage 4300, a modem 4400 and a user interface 4500.

Processor 4100 can control the whole operation of mobile system 4000 and can perform a logical operation. For example, processor 4100 can be constituted by a system-on-chip (SoC). Processor 4100 may be a general purpose processor or an application processor.

Memory 4200 can communicate with processor 4100. Memory 4200 may be an operation memory (or a main memory) of mobile system 4000 or processor 4100. Memory 4200 may include a volatile memory such as a DRAM, a SDRAM, etc. and a nonvolatile memory such as a flash memory, a phase-change RAM (PRAM), a magnetic RAM (MRAM), a resistive RAM (RRAM), a ferroelectric RAM (FRAM), etc.

Storage 4300 can store data which mobile system 4000 wants to store for a long time. Storage 4300 may include a hard disk drive (HDD) or a nonvolatile memory such as a flash memory, a phase-change RAM (PRAM), a magnetic RAM (MRAM), a resistive RAM (RRAM), a ferroelectric RAM (FRAM), etc.

Storage 4300 may be the nonvolatile memory system described with reference to FIGS. 1 to 20. Storage 4300 can perform an erase operation on the basis of the change erase condition when an operation mode is changed as described with reference to FIGS. 1 through 20.

Storage 4300 may include nonvolatile memory device 120 of FIG. 1 and processor 4100 may include memory controller 110 of FIG. 1. Processor 4100 is configured to control storage 4300, and processor 4100 and storage 4300 can operate based on the method(s) described with reference to FIGS. 1 through 20.

Memory 4200 and storage 4300 may be constituted by the same kind of nonvolatile memory. Memory 4200 and storage 4300 may be constituted in one semiconductor integrated circuit.

Modem 4400 can communicate with an external device under the control of processor 4100. For example, modem 4400 can perform a wired or wireless communication with an external device. Modem 4400 can perform a communication based on at least one of various wireless communication methods or standards such as a long term evolution (LTE), a WiMax, a global system for mobile communication (GSM), a code division multiple access (CDMA), a Bluetooth, a near field communication (NFC), WiFi, radio frequency Identification (RFID), etc. or various wired communication methods such as a universal serial bus (USB), a small computer system interface (SCSI), a peripheral component interconnection (PCI), a serial ATA, Firewire, etc.

User interface 4500 can communicate with a user under the control of processor 4100. User interface 4500 may include user input interfaces such as a keyboard, a keypad, a button, a touch panel, a touch screen, a touch pad, a touch ball, a camera, a mike, a gyroscope sensor, a vibration sensor, etc. User interface 4500 may include user output interfaces such as a liquid crystal display (LCD), an organic light emitting diode (OLED) display device, an active matrix OLED (AMOLED) display device, an LED, a speaker, a motor, etc.

Figure 26:
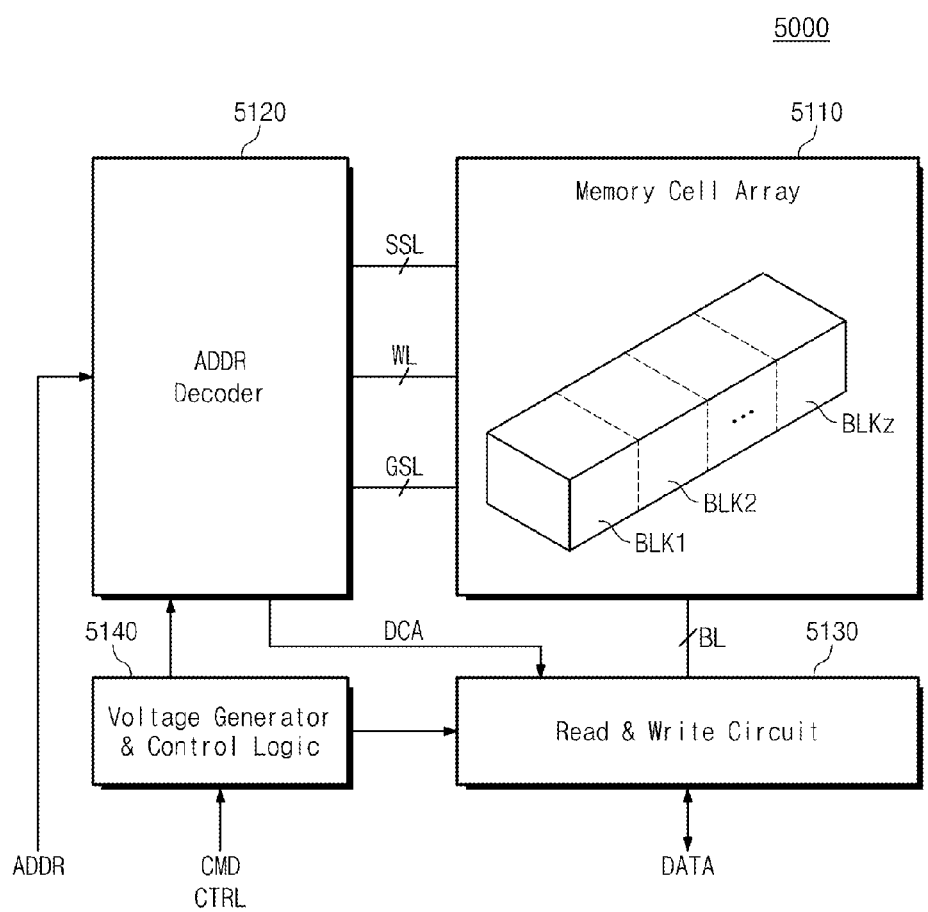
FIG. 26 is a block diagram illustrating a nonvolatile memory device having a three-dimensional structure in accordance with an embodiment of the inventive concept.

FIG. 26 is a block diagram illustrating a nonvolatile memory device having a three-dimensional structure in accordance with an embodiment of the inventive concept. Referring to FIG. 26, a nonvolatile memory device 5000 includes a memory cell array 5100, an address decoder 5200, a read & write circuit 5300 and a voltage generator & control logic 5400. Since address decoder 5200, read & write circuit 5300 and voltage generator & control logic 5400 were described with reference to FIG. 2, descriptions thereof are omitted.

Memory cell array 5100 is connected to address decoder 5200 through string select lines SSL, word lines WLs and ground select lines GSL. Memory cell array 5100 is connected to read & write circuit 5300 through bit lines BLs. Memory cell array 5100 includes a plurality of memory blocks BLK1~BLKz. Each memory block may include a plurality of memory cells and a plurality of select transistors. Memory cells may be connected to word lines WLs and select transistors may be connected to string select lines SSL and ground select lines GSL. Memory cells may be stacked in a direction perpendicular to a substrate to form a three-dimensional structure. Memory cells can store one or more bits.

Figure 27:
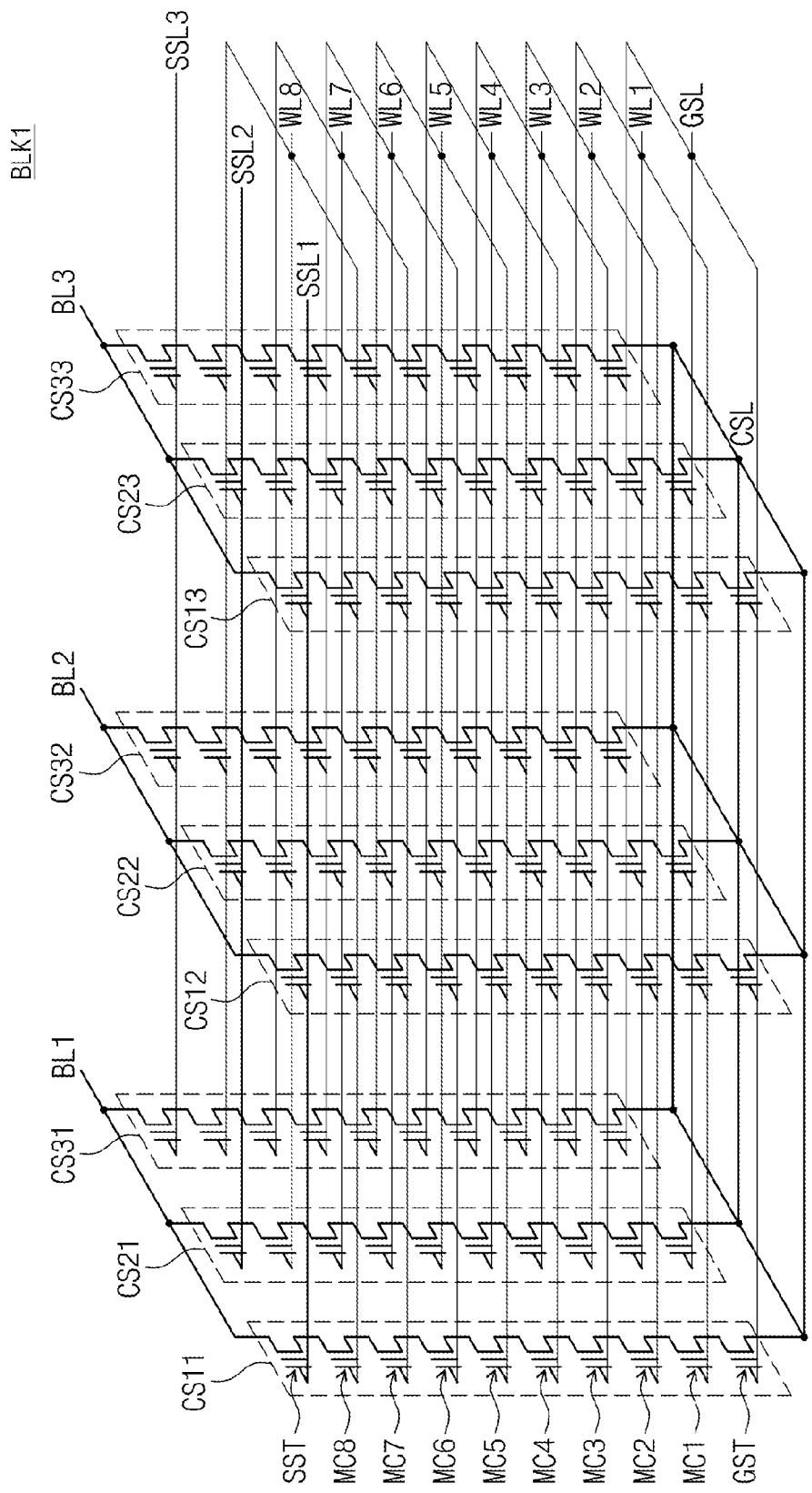
FIG. 27 is a circuit diagram illustrating an embodiment of a first memory block illustrated in FIG. 26.

FIG. 27 is a circuit diagram illustrating an embodiment of a first memory block illustrated in FIG. 26. Referring to FIG.

27, cell strings CS11~CS33 are connected between bit lines BL1~BL3 and a common source line CSL. Each string (e.g., CS11) includes a ground select transistor GST, a plurality of memory cells MC1~MC8 and a string select transistor SST. The cell string is called a NAND string.

The string select transistor SST is connected to a string select line SSL. The string select line SSL is divided into first, second and third string lines SSL1~SSL3. The memory cells MC1~MC8 are connected respective word line WL1~WL8. Word lines having a same height are connected in common. The ground select transistor GST is connected to a ground select line GSL. The ground select line GSL of each cell string is connected in common. The string select transistor SST is connected to a bit line BL and the ground select transistor GST is connected to the common source line CSL.

A technical spirit of the inventive concept is not limited to the memory block BLK1 illustrated in FIGS. 26 and 27. For example, the number of rows of cell strings may increase or decrease. As the number of rows of cell strings is changed, the number of string select lines or ground select lines connected to the rows of the cell string may be changed, and the number of cell strings connected to one bit line may also be changed.

The number of columns of cell strings may increase or decrease. As the number of columns of cell strings is changed, the number of bit lines connected to columns of cell strings may be changed, and the number of cell strings connected to one string select line may also be changed.

A height of cell strings may increase or decrease. That is, the number of memory cells being stacked on each cell string may increase or decrease. As the number of memory cells being stacked on each cell string is changed, the number of word lines may also be changed. For example, the number of string select transistors or ground select transistors being provided to each cell string may increase. As the number of string select transistors or ground select transistors being provided to each cell string is changed, the number of string select lines or ground select lines may also be changed. If the number of string select transistors or ground select transistors is increased, the string select transistors or the ground select transistors may be stacked in the same form as the memory cells MC1~MC8.

A write operation and a read operation may be performed by a unit of a row of cell strings CS11~CS33. The cell strings CS11~CS33 can be selected by a unit of a row of by string select lines SSL1~SSL3.

A write operation and a read operation may be performed by a unit of a page in a selected row of cell strings CS11~CS33. The page may be one row of memory cells connected to one word line. In a selected row of cell strings CS11~CS33, memory cells may be selected by a unit of a page by word lines WL1~WL8.

The operation method of the nonvolatile memory system described with reference to FIGS. 1 through 20 can be applied to the nonvolatile memory device having a three-dimensional structure described with reference to FIGS. 26 and 27.

According to the embodiments of the inventive concept described above, a nonvolatile memory system operates based on a plurality of operation modes. In the case that an operation mode is changed, the nonvolatile memory system may perform an erase operation on the basis of a change erase condition so that memory cells of memory blocks (or sub blocks, or word lines, or memory cells, etc.) that operate based on a changed operation mode become in an optimum erase state. Thus, since memory cells of memory blocks that operate based on a changed operation mode have an optimum erase state, reliability of the nonvolatile memory system may be improved.

According to the inventive concept, when an operation mode is changed, a nonvolatile memory system operates based on a change erase condition. Thus, since a threshold voltage of an erase state corresponding to a changed operation mode has an optimum state, a nonvolatile memory device may have improved reliability, and a nonvolatile memory system including the nonvolatile memory device, and an operation method of the nonvolatile memory system are provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of operating a memory system including a plurality of memory cells, the method comprising:
    operating the memory cells according to a first operational mode in which the memory cells are programmed according to a first program operation and erased by a first erase operation;
    changing the operation of the memory cells to a second operational mode by performing the first erase operation on the memory cells and, prior to performing the first program operation or a second program operation on the memory cells, subsequently performing a second erase operation on the memory cells; and
    operating the memory cells according to the second operational mode in which the memory cells are programmed according to the second program operation and erased by the second erase operation, wherein
    the first and second operational modes differ, the first and second program operations differ, and the first and second erase operations differ.

2. The method of claim 1, wherein the number of data bits stored in the memory cells in the first operational mode is different from the number of data bits stored in the memory cells in the second operational mode.

3. The method of claim 2, wherein the first operational mode is based on a single level cell wherein 1-bit data is stored in one memory cell and the second operation mode is based on a multi level cell wherein at least 2-bit data is stored in one memory cell.

4. The method of claim 2, wherein the first operational mode is based on a multi level cell wherein at least 2-bit data is stored in one memory cell and the second operational mode is based on a single level cell wherein 1-bit data is stored in one memory cell.

5. The method of claim 1, wherein an erase verification voltage of the first erase operation is less than or equal to an erase verification voltage of the second erase operation.

6. The method of claim 1, further comprising:
    ascertaining the number of programs and erase cycles performed on the memory cells; and
    changing the operation of the memory cells to the second operational mode when the ascertained number of programs and erase cycles on at least one of the memory cells is greater than a reference value.

7. The method of claim 1, further comprising:
    receiving an operational mode control signal from an external device; and
    changing the operation of the memory cells to the second operational mode in response to the received operational mode control signal.

8. The method of claim 7, wherein:
the operational mode control signal comprises operational mode information and storage capacity information, and
changing the operation of the memory cells to the second operational mode in response to the received operation mode control signal comprises assigning an area of which an operational mode is to be changed on the basis of the storage capacity information and changing the operational mode of the assigned area on the basis of the operational mode information.

9. A method of operating a memory system including a nonvolatile memory device having a plurality of memory cells, the method comprising:
operating the memory cells in a first operating mode in which the memory cells are programmed according to a first program operation and erased according to a first erase operation, the memory cells erased according to the first erase operation having a first threshold voltage distribution;
changing the operation of the memory cells to operate according to a second operating mode by erasing the memory cells according to the first erase operation and, prior to performing the first program operation or a second program operation on the memory cells, subsequently erasing the memory cells according to a second erase operation, the memory cells erased according to the second erase operation having a different threshold voltage distribution than the first threshold voltage distribution; and
operating the memory cells in the second operating mode in which the memory cells are programmed according to the second program operation and erased according to the second erase operation.

10. The method of claim 1, wherein the memory cells erased according to the second erase operation having a different threshold voltage distribution than the memory cells erased according to the first erase operation.

11. The method of claim 9, wherein each of the memory cells is programmed to store one bit of data in the first operating mode and programmed to store more than one bit of data in the second operating mode.

* * * * *